(12) United States Patent
Higashi et al.

(10) Patent No.: US 12,416,693 B2
(45) Date of Patent: Sep. 16, 2025

(54) SENSOR AND INSPECTION DEVICE

(71) Applicant: KABUSHIKI KAISHA TOSHIBA, Tokyo (JP)

(72) Inventors: Yoshihiro Higashi, Komatsu Ishikawa (JP); Akira Kikitsu, Yokohama Kanagawa (JP); Satoshi Shirotori, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 291 days.

(21) Appl. No.: 18/175,342

(22) Filed: Feb. 27, 2023

(65) Prior Publication Data

US 2024/0077551 A1 Mar. 7, 2024

(30) Foreign Application Priority Data

Sep. 1, 2022 (JP) ................................. 2022-139278

(51) Int. Cl.
*G01R 33/09* (2006.01)

(52) U.S. Cl.
CPC .................................. *G01R 33/09* (2013.01)

(58) Field of Classification Search
CPC ...................................................... G01R 33/09
See application file for complete search history.

(56) References Cited

U.S. PATENT DOCUMENTS

| | | | | |
|---|---|---|---|---|
| 8,447,556 B2* | 5/2013 | Friedrich | ........... | G01R 33/0035 |
| | | | | 702/183 |
| 2017/0212188 A1* | 7/2017 | Kikitsu | ................ | G01R 33/025 |
| 2019/0369172 A1 | 12/2019 | Kikitsu et al. | | |

(Continued)

FOREIGN PATENT DOCUMENTS

| | | |
|---|---|---|
| JP | 2019-207167 A | 12/2019 |
| JP | 2021-145021 A | 9/2021 |

(Continued)

OTHER PUBLICATIONS

Andre Guedes et al., "Hybrid GMR Sensor Detecting 950 pT/sqrt(Hz) at 1 Hz and Room Temperature," Sensors, vol. 18, No. 790, 8 pages, DOI: 10.3390/s18030790 (2018).

(Continued)

*Primary Examiner* — Reena Aurora
(74) *Attorney, Agent, or Firm* — Finnegan, Henderson, Farabow, Garrett & Dunner, LLP

(57) ABSTRACT

According to one embodiment, a sensor includes an element portion including a first element, and a controller. The first element includes a first magnetic element including a first magnetic layer and a first opposing magnetic layer, and a first conductive member including a first conductive portion and a first other conductive portion. A second direction from the first other conductive portion to the first conductive portion crosses a first direction from the first magnetic layer to the first opposing magnetic layer. The controller includes a first circuit electrically connected to the first conductive portion and the first other conductive portion, and configured to supply a first current including an AC component to the first conductive member. A local maximum value of the first current is of the first polarity. A local minimum value of the first current is of the first polarity or 0.

18 Claims, 19 Drawing Sheets

(56) References Cited

U.S. PATENT DOCUMENTS

| | | |
|---|---|---|
| 2021/0286023 A1 | 9/2021 | Okatake et al. |
| 2021/0286029 A1 | 9/2021 | Higashi et al. |
| 2022/0065955 A1 | 3/2022 | Kikitsu et al. |
| 2023/0266411 A1* | 8/2023 | Kikitsu ................ G01R 33/091 324/207.21 |

FOREIGN PATENT DOCUMENTS

| | | |
|---|---|---|
| JP | 2022-37688 A | 3/2022 |
| JP | 2022-41644 A | 3/2022 |
| WO | WO 2019-207874 A1 | 10/2019 |
| WO | WO 2020-138170 A1 | 2/2020 |

OTHER PUBLICATIONS

Long Pan et al., "Novel Magnetic Field Modulation Concept Using Multiferroic Heterostructure for Magnetoresistive Sensors," Sensors, vol. 20, No. 1440, 13 pages, DOI: 10.3390/s20051440 (2020).

* cited by examiner

SENSOR AND INSPECTION DEVICE

CROSS-REFERENCE TO RELATED APPLICATIONS

This application is based upon and claims the benefit of priority from Japanese Patent Application No. 2022-139278, filed on Sep. 1, 2022; the entire contents of which are incorporated herein by reference.

FIELD

Embodiments described herein generally relate to a sensor and an inspection device.

BACKGROUND

For example, there is a sensor using a magnetic layer. It is desired to improve the characteristics of the sensor.

DETAILED DESCRIPTION

Figure 1A:
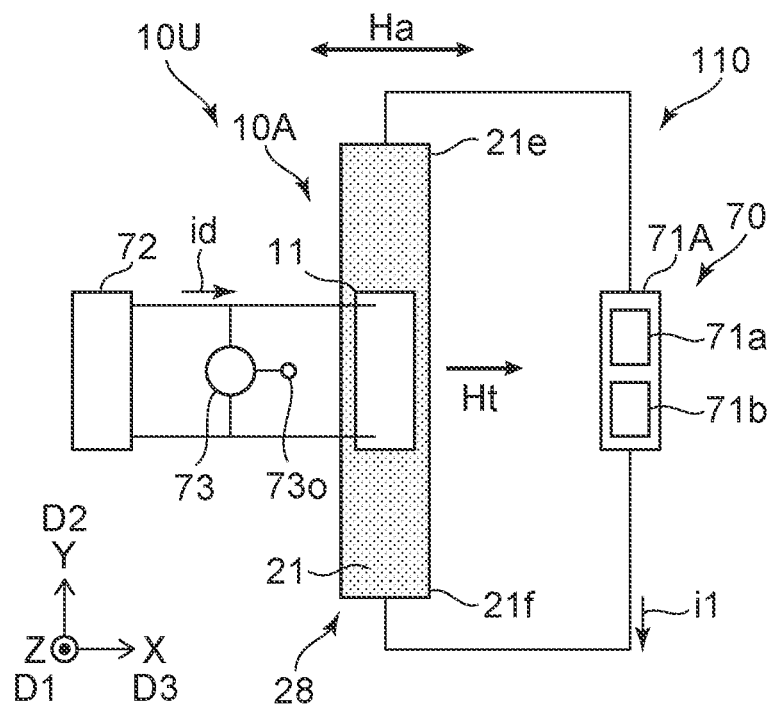
FIGS. 1A to 1C are schematic views illustrating a sensor according to a first embodiment.

According to one embodiment, a sensor includes an element portion and a controller. The element portion includes a first element. The first element includes a first magnetic element and a first conductive member. The first magnetic element includes a first magnetic layer and a first opposing magnetic layer. The first conductive member includes a first conductive portion and a first other conductive portion. A second direction from the first other conductive portion to the first conductive portion crosses a first direction from the first magnetic layer to the first opposing magnetic layer. A rate of a change in a first electrical resistance of the first magnetic element with respect to a change in a third direction magnetic field along a third direction crossing a plane including the first direction and the second direction is higher than a rate of a change in the first electrical resistance with respect to a change in a second direction magnetic field along the second direction. The controller includes a first circuit. The first circuit is electrically connected to the first conductive portion and the first other conductive portion, and is configured to supply a first current to the first conductive member. The first current includes an AC component. A local maximum value of the first current is of the first polarity. A local minimum value of the first current is of the first polarity or 0.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIGS. 1A to 1C and FIGS. 2A to 2C are schematic views illustrating a sensor according to the first embodiment.

Figure 2A:
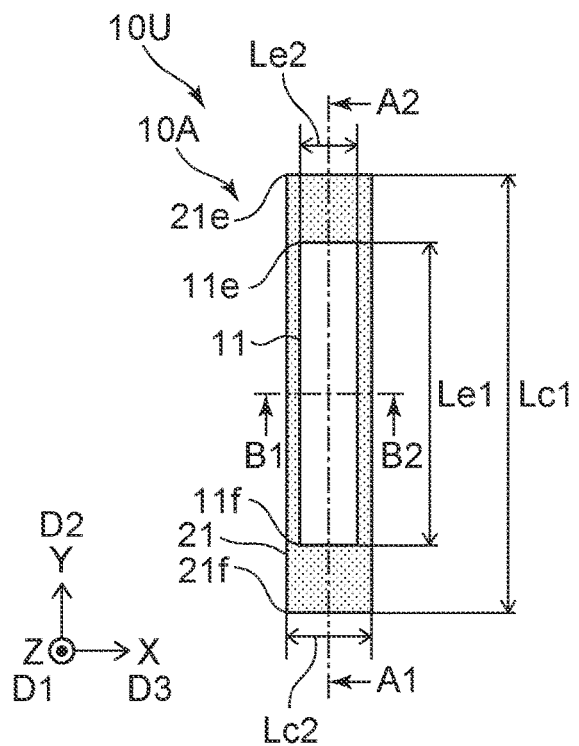
FIGS. 2A to 2C are schematic views illustrating the sensor according to the first embodiment.
Figure 2B:
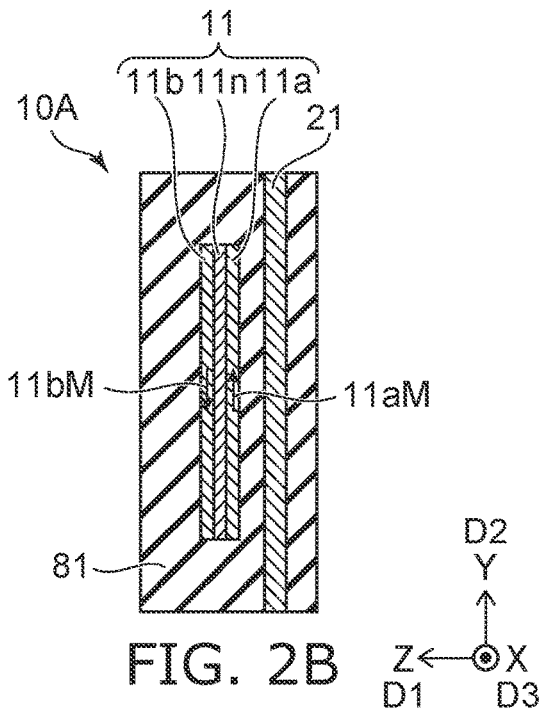
Figure 2C:
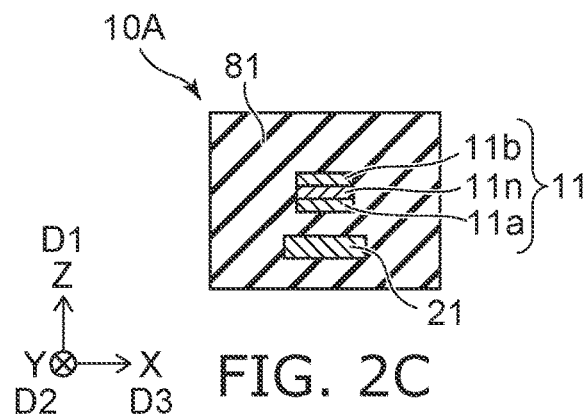

FIG. 2A is a plan view. FIG. 2B is a sectional view taken along the line A1-A2 of FIG. 2A. FIG. 2C is a cross-sectional view taken along the line B1-B2 of FIG. 2A.

As shown in FIG. 1A, a sensor 110 according to the embodiment includes an element portion 10U and a controller 70.

The element portion 10U includes a first element 10A. The sensor 110 is, for example, a magnetic sensor.

The first element 10A includes a first magnetic element 11 and a first conductive member 21.

As shown in FIG. 2B, the first magnetic element 11 includes a first magnetic layer 11a and a first opposing magnetic layer 11b. In this example, the first magnetic element 11 includes a first non-magnetic layer 11n. The first non-magnetic layer 11n is provided between the first magnetic layer 11a and the first opposing magnetic layer 11b.

A first direction D1 from the first magnetic layer 11a to the first opposing magnetic layer 11b is defined as a Z-axis direction. One direction perpendicular to the Z-direction is defined as a Y-axis direction. The direction perpendicular to the Z-axis direction and the Y-axis direction is defined as an X-axis direction.

As shown in FIG. 1A, the first conductive member 21 includes a first conductive portion 21e and a first other conductive portion 21f. A second direction D2 from the first other conductive portion 21f to the first conductive portion 21e crosses the first direction D1. The second direction D2 is, for example, the Y-axis direction.

In the embodiment, the sensor 110 is configured to detect a detection target magnetic field Ht. The detection target magnetic field Ht includes a component along a third direction D3. The third direction D3 crosses a plane including the first direction D1 and the second direction D2. The third direction D3 is, for example, the X-axis direction.

In the sensor 110, the electrical resistance (first electrical resistance) of the first magnetic element 11 is configured to change according to a change in the detection target magnetic field Ht.

For example, a rate of the change of the first electrical resistance of the first magnetic element with respect to the change of a third direction magnetic field along the third direction D3 is higher than a rate of the change of the first electrical resistance with respect to the change of the second direction magnetic field along the second direction D2. The first electrical resistance of the first magnetic element 11 has high sensitivity with respect to the third direction magnetic field.

The controller 70 includes a first circuit 71A. The first circuit 71A is electrically connected to the first conductive portion 21e and the first other conductive portion 21f. The first circuit 71A is configured to supply a first current i1 to the first conductive member 21.

Figure 1B:
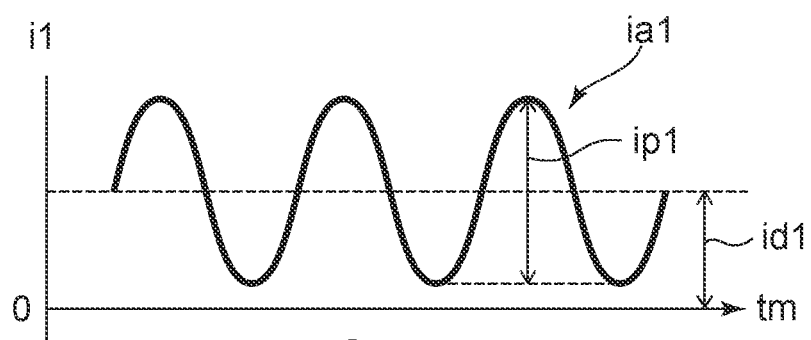

FIG. 1B illustrates the first current i1. The horizontal axis of FIG. 1B is time tm. The vertical axis in FIG. 1B is the value of the first current i1. As shown in FIG. 1B, the first current i1 includes an AC component ia1. The local maximum value of the first current i1 is of a first polarity, and the local minimum value of the first current i1 is of the first polarity or 0. The first polarity is one of positive and negative. An example in which the first polarity is positive will be described below.

For example, the first current i1 includes an AC component ia1 and a DC component id1. The DC component id1 is equal to or greater than ½ of the amplitude ip1 of the AC component ia1. For the first current i1, the difference between the local minimum value and maximum value corresponds to the amplitude ip1. In embodiments, for example, both the local minimum value and the local maximum value are of the first polarity (or the local minimum value is 0). The first current i1 never becomes a second polarity (e.g., negative). The local minimum value of the first current i1 may be the first polarity.

Figure 1C:
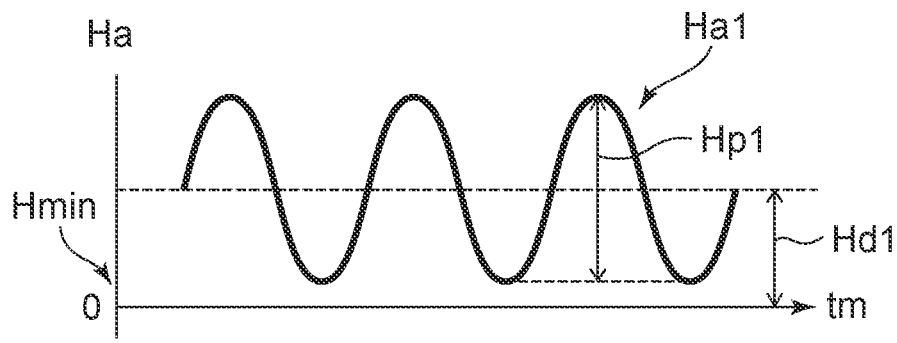

A first magnetic field Ha is generated by the first current i1. The first magnetic field Ha is along the third direction D3. FIG. 1C illustrates the first magnetic field Ha. The horizontal axis of FIG. 1C is time tm. The vertical axis of FIG. 1C is the intensity of the first magnetic field Ha. As shown in FIG. 1C, the first magnetic field Ha includes an alternating magnetic field component Ha1. The maximum of the first magnetic field Ha is the first polarity and the minimum of the first magnetic field Ha is the first polarity or zero. The minimum value of the first magnetic field Ha may be the first polarity.

For example, the first magnetic field Ha includes an AC magnetic field component Ha1 and a DC magnetic field component Hd1. The DC magnetic field component Hd1 is more than ½ of the amplitude Hp1 of the AC magnetic field component Ha1. In the first magnetic field Ha, the difference between the local minimum value and the local maximum value corresponds to the amplitude Hp1. In embodiments, both the local minimum value and the local maximum value are of the first polarity (or the local minimum is 0). The first magnetic field Ha never becomes the second polarity (e.g., negative). The first magnetic field Ha never becomes zero. The minimum value Hmin of the first magnetic field Ha is the difference between the DC magnetic field component Hd1 and ½ of the amplitude Hp1 of the AC magnetic field component Ha1. In embodiments, for example, the local minimum value Hmin of the first magnetic field Ha is positive or zero.

The first magnetic field Ha is generated from the first conductive member 21 by the first current i1 flowing through the first conductive member 21. The first conductive member 21 is one example of the magnetic field generator 28. The first magnetic field Ha along the third direction D3 is generated from the magnetic field generator 28.

The first magnetic field Ha is applied to the first magnetic element 11. The first electrical resistance of the first magnetic element 11 changes according to the change in the first magnetic field Ha. The change in the electrical resistance is due to, for example, an MR effect (magnetoresistance effect). For example, the first electrical resistance of the first magnetic element 11 changes according to the change in the first current i1.

On the other hand, the detection target magnetic field Ht is applied to the first magnetic element 11. The first electrical resistance of the first magnetic element 11 also changes depending on the detection target magnetic field Ht. Thus, the first electrical resistance changes according to both the first current i1 (and the first magnetic field Ha) and the detection target magnetic field Ht. In the embodiment, by detecting the change in the first electrical resistance, and by processing the result based on the frequency of the AC component ia1 of the first current i1 (the frequency of the AC magnetic field component Ha1 of the first magnetic field Ha), the detection target magnetic field Ht can be detected.

In embodiments, as described above, the first current i1 and the first magnetic field Ha do not become negative. This enables detection with suppressed noise.

Figure 3:
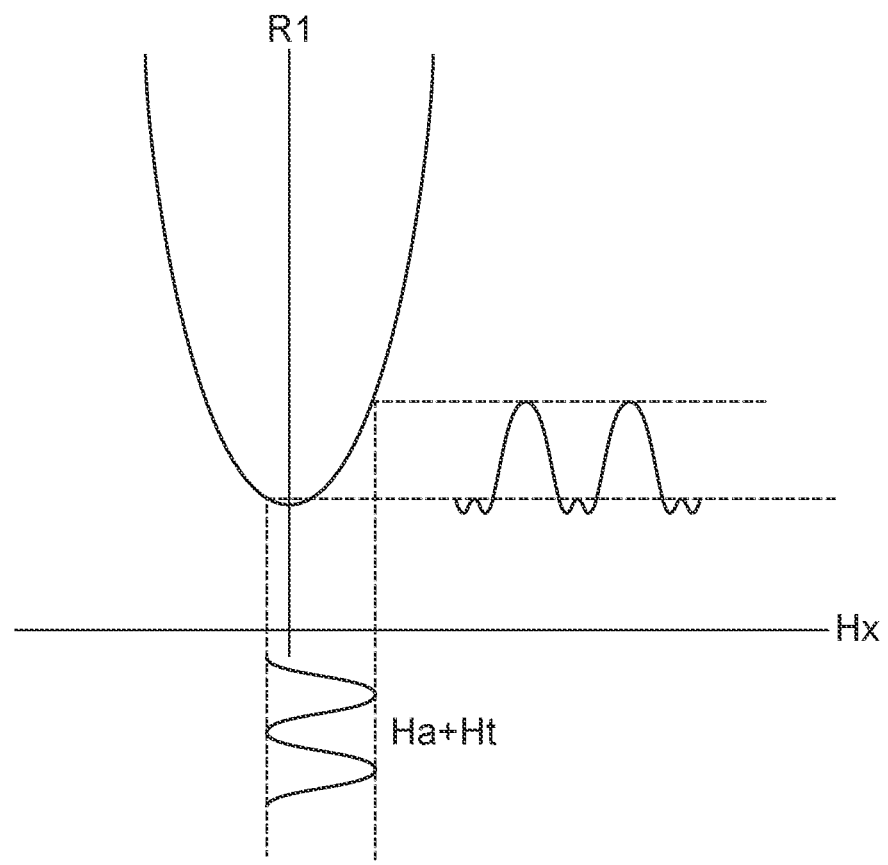
FIG. 3 is a schematic diagram illustrating characteristics of the sensor.
Figure 4:
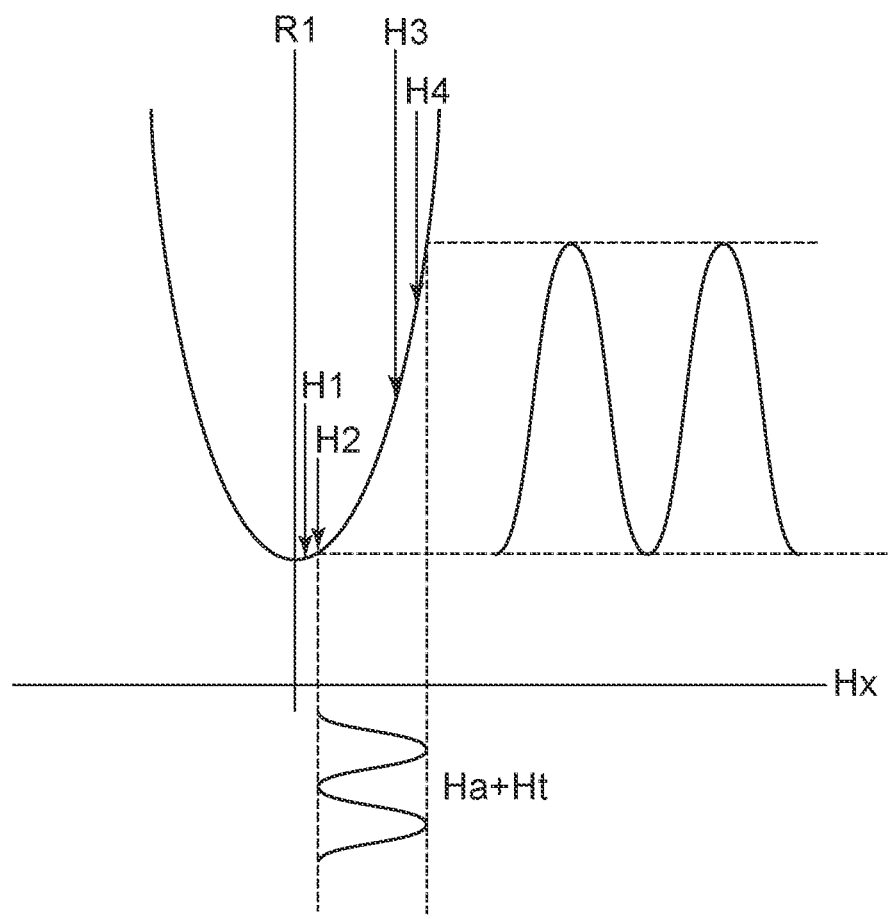
FIG. 4 is a schematic diagram illustrating characteristics of the sensor.

FIGS. 3 and 4 are schematic diagrams illustrating characteristics of the sensor.

The horizontal axis of these figures is the magnetic field Hx applied to the first magnetic element 11. The vertical axis is the first electrical resistance R1 of the first magnetic element 11. The first electrical resistance R1 corresponds to the potential difference across the first magnetic element 11.

As shown in FIG. 3, the first electrical resistance R1 of the first magnetic element 11 changes nonlinearly (e.g., quadratic function) with respect to the magnetic field Hx. The rate of change of the first electrical resistance R1 with respect to the magnetic field Hx with a large absolute value is higher than the rate of change of the first electrical resistance R1 with respect to the magnetic field Hx with a small absolute value.

As shown in FIG. 3, the sum of the first magnetic field Ha based on the first current i1 and the detection target magnetic field Ht is applied to the first magnetic element 11. In the example of FIG. 3, the first magnetic field Ha changes between positive and negative. The first electrical resistance R1 changes according to such a change in the magnetic field. In the example of FIG. 3, the change in the first electrical resistance R1 is small. In the example of FIG. 3, the range in which the rate of change of the first electrical resistance R1 is low is used for detection.

In the example shown in FIG. 4, the first magnetic field Ha changes in the positive range and does not become negative. The first electrical resistance R1 changes according to such a change in the magnetic field. In the example of FIG. 4, the change in the first electrical resistance R1 is larger than that in the example of FIG. 3. In the example of FIG. 4, a range in which the rate of change of the first electrical resistance R1 is high is used for detection.

In the embodiments, the local maximum value of the first current i1 is of the first polarity, and the local minimum value of the first current i1 is the first polarity or 0. In the embodiment, the first current i1 which changes with one polarity is used. Thus, the range in which the rate of change of the first electrical resistance R1 is high can be used for detection. For example, detection with high sensitivity is possible. For example, a high SN ratio is obtained. According to the embodiments, it is possible to provide a sensor capable of improving characteristics.

In the embodiment, the first current i1 is used that changes with one polarity. This provides, for example, a wide dynamic range. For example, the change in the detection target magnetic field Ht may be smaller than the change in the first magnetic field Ha caused by the first current i1. In such a case, by controlling the DC component id1 of the first current i1 it becomes easier to match the electric signal corresponding to the change in the first electrical resistance R1 to the characteristics of the signal detection circuit. It is possible to amplify the signal with low noise. Detection with high precision becomes possible.

For example, when the first current i1 (and the first magnetic field) changes from positive to 0 or negative, domain disturbance may occur in at least one of the first magnetic layer 11a and the first opposing magnetic layer 11b. Disturbance of magnetic domains includes, for example, generation of magnetic domains, disappearance of magnetic domains, movement of magnetic domains, and the like. Noise may occur in the signal obtained from the first magnetic element 11 due to disturbance of the magnetic domain. In the embodiment, when the first current i1 and the first magnetic field Ha always have one polarity (for example, positive), noise caused by disturbance of magnetic domains can be suppressed. More stable and highly sensitive detection becomes possible.

As shown in FIG. 4, the first electrical resistance R1 changes as an even function with respect to the magnetic field Hx applied to the first magnetic element 11. The change in the first electrical resistance R1 is non-linear (for example, a quadratic function).

The magnetic field Hx (the third direction magnetic field) applied to the first magnetic element 11 includes a first value magnetic field H1, a second value magnetic field H2, a third value magnetic field H3, and a fourth value magnetic field H4. The first value magnetic field H1 is between 0 and the fourth value magnetic field H4. The second value magnetic field H2 is between the first value magnetic field H1 and the fourth value magnetic field H4. The third value magnetic field H3 is between the second value magnetic field H2 and the fourth value magnetic field H4. The difference between the first value magnetic field H1 and the second value magnetic field H2 is the same as the difference between the third value magnetic field H3 and the fourth value magnetic field H4.

In the embodiment, a first rate of change in the first electrical resistance R1 with respect to the change between the first value magnetic field H1 and the second value magnetic field H2 is lower than a second rate of change in the first electrical resistance R1 with respect to the change between the third value magnetic field H3 and the fourth value magnetic field H4. In the range between the third value magnetic field H3 and the fourth value magnetic field H4 where the absolute value of the magnetic field Hx is relatively large, the first electrical resistance R1 has a high rate of change.

In the embodiment, the range having such a high rate of change is used for detection. For example, the magnetic field (the first magnetic field Ha) generated from the first conductive member 21 by the first current i1 includes the third value magnetic field H3 and the fourth value magnetic field H4. The change in the first electrical resistance R1 is in any function being convex upward.

As shown in FIG. 1A, the first circuit 71A may include an AC circuit 71a and a DC circuit 71b. The AC circuit 71a is, for example, an AC power supply. The DC circuit 71b is, for example, a DC power supply. The DC component id1 may be variable by the DC circuit 71b.

As shown in FIG. 1A, the controller 70 may include an element current circuit 72. The element current circuit 72 is configured to supply a detection current id to the first magnetic element 11. The element current circuit 72 may be a constant current source. The element current circuit 72 may not be a constant current source.

As shown in FIG. 1A, the controller 70 may include a detection circuit 73. The detection circuit 73 is configured to detect a value corresponding to a change in the first electrical resistance R1. For example, the detection current id causes a potential difference corresponding to the first electrical resistance R1. The detection circuit 73 detects a signal including the change in potential difference. The signal corresponding to the detection target magnetic field Ht is obtained from an output portion 73o of the detection circuit 73.

As shown in FIG. 2A, a length of the first conductive member 21 in the second direction D2 is defined as a length Lc1. A length of the first conductive member 21 in the third direction D3 is defined as a length Lc2. In embodiments, the length Lc1 is preferably longer than the length Lc2. The third direction D3 crosses a plane including the first direction D1 and the second direction D2. The direction of the generated magnetic field (the first magnetic field Ha) becomes more stable. A ratio (Lb1/Lb2) of the length Lb1 to the length Lb2 is, for example, not less than and not more than 1000.

As shown in FIG. 2A, a length of the first magnetic element 11 in the second direction D2 is defined as the length Le1. A length of the first magnetic element 11 in the third direction D3 is defines as a length Le2 In embodiments, the length Le1 is preferably longer than the length Le2. This makes the magnetization direction of the magnetic layer more stable. This is due to shape anisotropy. A ratio (Le1/Le2) of the length L1 to the length L2 is, for example, not less than 2 and not more than 1000.

As shown in FIG. 2B, in this example, the magnetization 11aM of the first magnetic layer 11a is along the second direction D2 when the first current i1 is not flowing. The magnetization 11bM of the first opposing magnetic layer 11b is along the second direction D2. In embodiments, magnetization 11aM may cross magnetization 11bM. In embodiments, the first magnetic layer 11a may be, for example, one of a reference layer and a magnetization free layer. The first opposing magnetic layer 11b may be, for example, the other of the reference layer and the magnetization free layer.

A change in the first electrical resistance of the first magnetic element 11 is based on, for example, a change in the angle between the magnetization 11aM and the magnetization 11bM according to the magnetic field applied to the first magnetic element 11.

As shown in FIGS. 2B and 2C, in this example, the direction from the first conductive member 21 to the first magnetic element 11 is along the first direction D1. In this example, the first magnetic layer 11a is located between the first conductive member 21 and the first opposing magnetic layer 11b. In embodiments, the first opposing magnetic layer 11*b* may located between the first conductive member 21 and the first magnetic layer 11*a*.

In the embodiments, the first non-magnetic layer 11*n* may be conductive. The first non-magnetic layer 11*n* includes, for example, Cu. The first magnetic element functions as a GMR (Giant Magnetoresistive effect) element. The first non-magnetic layer 11*n* may be insulative. The first non-magnetic layer 11*n* includes, for example, MgO. The first magnetic element functions as a TMR (Tunnel Magneto Resistance effect) element.

As shown in FIGS. 2B and 2C, the first element 10A may include a first insulating member 81. At least a part of the first insulating member 81 is provided between the first magnetic element 11 and the first conductive member 21. The first insulating member 81 electrically insulates between the first magnetic element 11 and the first conductive member 21.

As shown in FIG. 2A, the first magnetic element 11 includes a first element portion 11*e* and a first other element portion 11*f*. The first element portion 11*e* corresponds to the first conductive portion 21*e*. The first other element portion 11*f* corresponds to the first other conductive portion 21*f*. A direction from the first other element portion 11*f* to the first element portion 11*e* is along the second direction D2. A distance between the first element portion 11*e* and the first conductive portion 21*e* is shorter than a distance between the first element portion 11*e* and the first other conductive portion 21*f*. A distance between the first other element portion 11*f* and the first other conductive portion 21*f* is shorter than a distance between the first other element portion 11*f* and the first conductive portion 21*e*.

Several examples of the sensors according to embodiments are described below.

Figure 5:
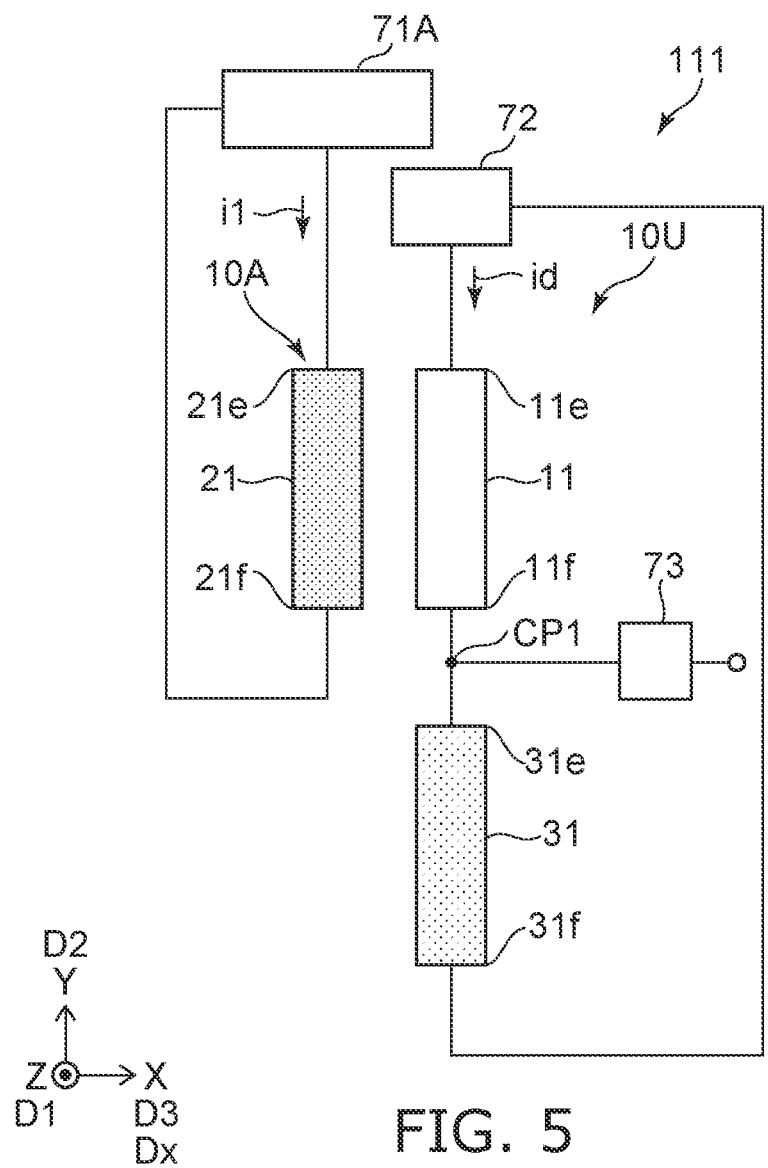
FIG. 5 is a schematic view illustrating a sensor according to the first embodiment.

FIG. 5 is a schematic view illustrating a sensor according to the first embodiment.

In FIG. 5, the first magnetic element 11 is shown shifted from the first conductive member 21 in the X-axis direction for easy understanding. The first magnetic element 11 may overlap the first conductive member 21 in the Z-axis direction.

As shown in FIG. 5, in a sensor 111 according to the embodiment, the element portion 10U includes the first element 10A and the first resistor 31. The first resistor 31 includes a first resistor portion 31*e* and a first other resistor portion 31*f*. In this example, the first element portion 11*e* is electrically connected to the element current circuit 72. The first other element portion 11*f* is electrically connected to the first resistor portion 31*e*. The first other resistor portion 31*f* is electrically connected to the element current circuit 72. The detection circuit 73 detects a change in potential at the connection point of the first other element portion 11*f* and the first resistor portion 31*e*.

FIGS. 6 and 7A to 7C are schematic views illustrating a sensor according to the first embodiment.

Figure 6:
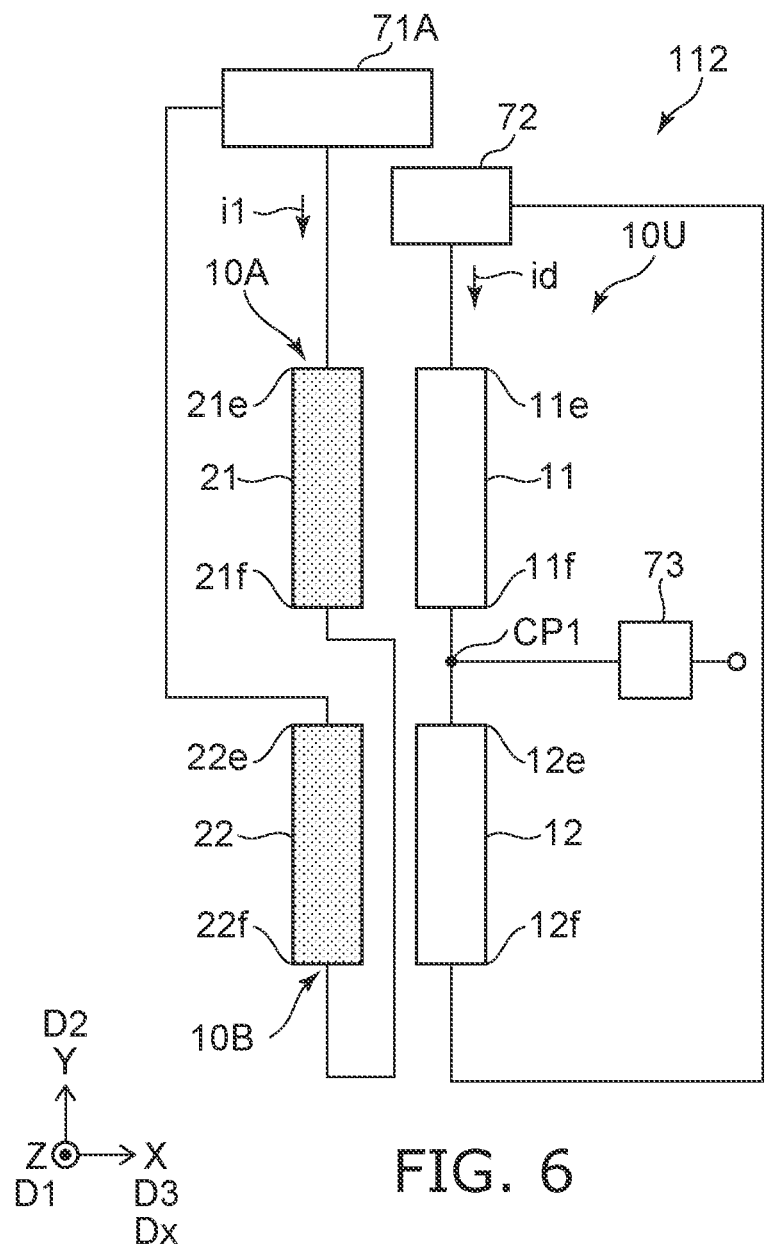
FIG. 6 is a schematic view illustrating a sensor according to the first embodiment.

As shown in FIG. 6, in a sensor 112 according to the embodiment, the element portion 10U further includes a second element 10B. The second element 10B includes a second magnetic element 12 and a second conductive member 22.

In FIG. 6, the first magnetic element 11 is shown shifted from the first conductive member 21 in the X-axis direction for clarity of illustration. The first magnetic element 11 may overlap the first conductive member 21 in the Z-axis direction. In FIG. 6, the second magnetic element 12 is shown shifted from the second conductive member 22 in the X-axis direction for clarity. The second magnetic element 12 may overlap the second conductive member 22 in the Z-axis direction.

Figure 7A:
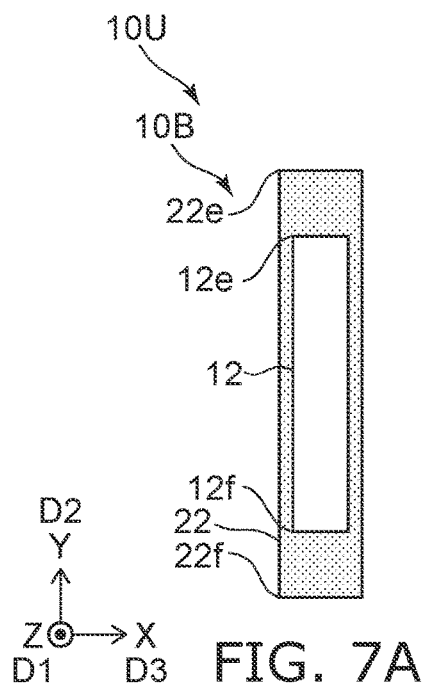
FIGS. 7A to 7C are schematic views illustrating the sensor according to the first embodiment.
Figure 7B:
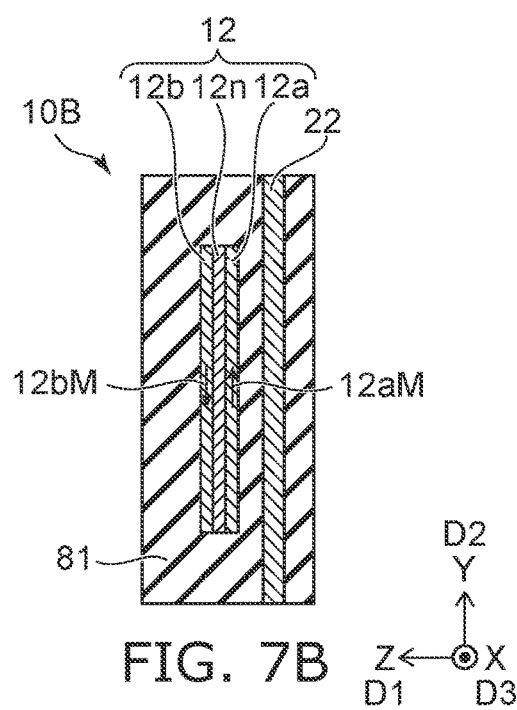
Figure 7C:
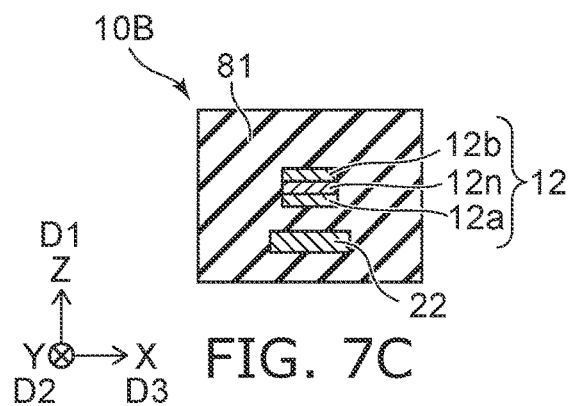

As shown in FIGS. 7B and 7C, the second magnetic element 12 includes a second magnetic layer 12*a* and a second opposing magnetic layer 12*b*. In this example, the second magnetic element 12 includes a second non-magnetic layer 12*n*. The second non-magnetic layer 12*n* is provided between the second magnetic layer 12*a* and the second opposing magnetic layer 12*b*.

In the second magnetic element 12, the second magnetic layer 12*a* may be, for example, one of the reference layer and the magnetization free layer. The second opposing magnetic layer 12*b* may be, for example, the other of the reference layer and the magnetization free layer. The change in electrical resistance of the second magnetic element 12 is based on, for example, a change in the angle between the magnetization 12*a*M of the second magnetic layer 12*a* and the magnetization 12*b*M of the second opposing magnetic layer 12*b* according to the magnetic field applied to the second magnetic element 12.

As shown in FIG. 6, the second conductive member 22 includes a second conductive portion 22*e* and a second other conductive portion 22*f*. A direction from the second other conductive portion 22*f* to the second conductive portion 22*e* is along the second direction D2.

As shown in FIG. 6, in this example, the first conductive portion 21*e* is electrically connected to the first circuit 71A. The first other conductive portion 21*f* is electrically connected to the second other conductive portion 22*f*. The second conductive portion 22*e* is electrically connected to the first circuit 71A. The first circuit 71A is configured to supply the first current i1 to the first conductive member 21 and the second conductive member 22.

The first magnetic element 11 includes a first element portion 11*e* and a first other element portion 11*f*. The first element portion 11*e* corresponds to the first conductive portion 21*e*. The first other element portion 11*f* corresponds to the first other conductive portion 21*f*. An orientation from the first element portion 11*e* to the first other element portion 11*f* is a first orientation.

The second magnetic element 12 includes a second element portion 12*e* and a second other element portion 12*f*. The second element portion 12*e* corresponds to the second conductive portion 22*e*. The second other element portion 12*f* corresponds to the second other conductive portion 22*f*. An orientation from the second element portion 12*e* to the second other element portion 12*f* is a second orientation.

The detection current id supplied from the element current circuit 72 flows through the first magnetic element 11 in the first orientation and flows through the second magnetic element 12 in the second orientation. When the first current i1 supplied from the first circuit 71A flows through the first conductive member 21 in the first direction, the first current i1 flows through the second conductive member 22 in the opposite orientation of the second orientation.

Figure 8:
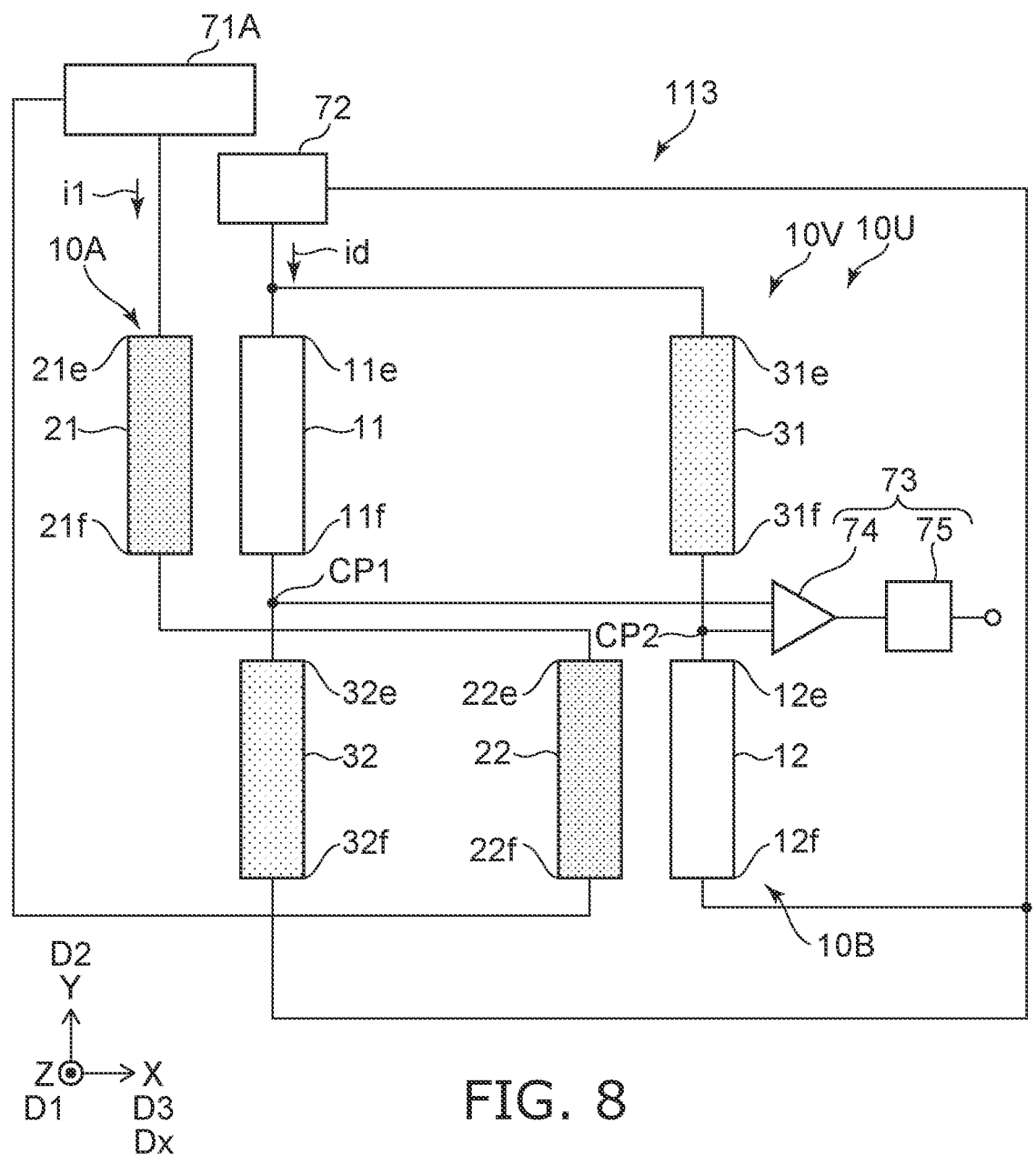
FIG. 8 is a schematic diagram illustrating a sensor according to the first embodiment.

FIG. 8 is a schematic diagram illustrating the sensor according to the first embodiment.

As shown in FIG. 8, in a sensor 113 according to the embodiment, the element portion 10U includes the first element 10A, the second element 10B, the first resistor 31 and a second resistor 32. The first element 10A includes the first magnetic element 11 and the first conductive member 21. The second element 10B includes the second magnetic element 12 and the second conductive member 22. In FIG. 8, the first magnetic element 11 is shown shifted from the first conductive member 21 in the X-axis direction for clarity of illustration. In FIG. 8, the second magnetic element 12 is shown shifted from the second conductive member 22 in the X-axis direction for clarity of illustration.

The first magnetic element 11 includes the first element portion 11e and the first other element portion 11f. The first element portion 11e corresponds to the first conductive portion 21e. The first other element portion 11f corresponds to the first other conductive portion 21f. The orientation from the first element portion 11e to the first other element portion 11f is the first orientation.

The second element 10B includes the second magnetic element 12 and the second conductive member 22. The second conductive member 22 includes the second conductive portion 22e and the second other conductive portion 22f. The direction from the second other conductive portion 22f to the second conductive portion 22e is along the second direction D2.

The first resistor 31 includes the first resistor portion 31e and a first other resistor portion 31f. The direction from the first other resistor portion 31f to the first resistor portion 31e is along the second direction D2. The second resistor 32 includes the second resistor portion 32e and the second other resistor portion 32f. The direction from the second other resistor portion 32f to the second resistor portion 32e is along the second direction D2.

The second magnetic element 12 includes the second element portion 12e and the second other element portion 12f. The second element portion 12e corresponds to the second conductive portion 22e. The second other element portion 12f corresponds to the second other conductive portion 22f. The orientation from the second element portion 12e to the second other element portion 12f is the second orientation.

The first element portion 11e is electrically connected to the element current circuit 72. The first other element portion 11f is electrically connected to the second resistor portion 32e. The second other resistor portion 32f is electrically connected to the element current circuit 72.

The first resistor portion 31e is electrically connected to the element current circuit 72. The first other resistor portion 31f is electrically connected to the second element portion 12e. The second other element portion 12f is electrically connected to the element current circuit 72.

The detection current id flows through the first magnetic element 11 in the first orientation and through the second magnetic element 12 in the second orientation.

As shown in FIG. 8, in this example, the first conductive portion 21e is electrically connected to the first circuit 71A. The first other conductive portion 21f is electrically connected to the second conductive portion 22e. The second other conductive portion 22f is electrically connected to the first circuit 71A. The first circuit 71A is configured to supply the first current i1 to the first conductive member 21 and the second conductive member 22.

When the first current i1 is flowing through the first conductive member 21 in the first orientation, the first current i1 flows through the second conductive member 22 in the second orientation.

The detection circuit 73 is configured to detect the potential difference between the first connection point CP1 and the second connection point CP2. The first connection point CP1 is a connection point between the first other element portion 11f and the second resistor portion 32e. The second connection point CP2 is a connection point between the first other resistor portion 31f and the second element portion 12e.

The detection circuit 73 may include a differential amplifier 74 and a processing circuit 75. The differential amplifier 74 detects the potential difference between the first connection point CP1 and the second connection point CP2. The processing circuit 75 processes the output signal from the differential amplifier 74. The processing circuit 75 may include, for example, at least one of a lock-in amplifier, a bandpass filter circuit, or an FFT (Fast Fourier Transform) circuit. The processing circuit 75 extracts the first frequency component of the output from the differential amplifier 74, for example. The first frequency is, for example, the frequency of the AC component ia1 of the first current i1. The first frequency is, for example, the frequency of the alternating magnetic field component Ha1 of the first magnetic field Ha. The first frequency may include, for example, harmonic components of the AC component ia1 of the first current i1. The first frequency may include, for example, harmonic components of the alternating magnetic field component Ha1 of the first magnetic field Ha.

Thus, the element portion 10U may include a bridge circuit 10V (see FIG. 8) including the first element 10A. The element current circuit 72 is configured to supply the detection current id to the bridge circuit 10V. The detection circuit 73 is configured to detect the value corresponding to the difference between the potential at the first midpoint of the bridge circuit 10V (for example, the first connection point CP1) and the potential at the second midpoint of the bridge circuit 10V (for example, the second connection point CP2).

Figure 9:
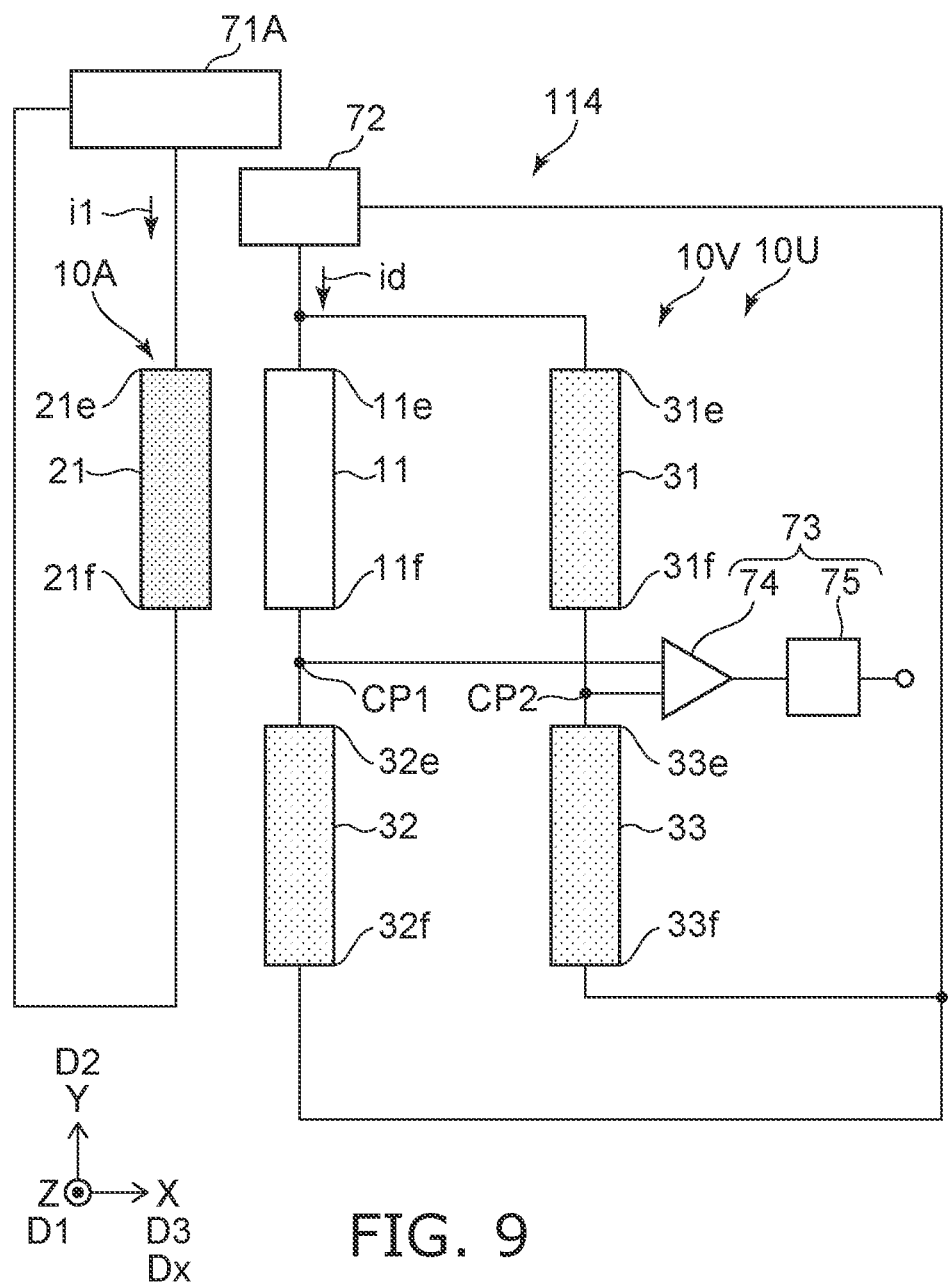
FIG. 9 is a schematic view illustrating a sensor according to the first embodiment.

FIG. 9 is a schematic view illustrating the sensor according to the first embodiment.

As shown in FIG. 9, in a sensor 114 according to the embodiment, the element portion 10U includes the first element 10A, the first resistor 31, the second resistor 32 and a third resistor 33. The third resistor 33 includes a third resistor portion 33e and a third other resistor portion 33f. A direction from the third other resistor portion 33f to the third resistor portion 33e is along the second direction D2.

In this example, the first element portion 11e is electrically connected to the element current circuit 72. The first other element portion 11f is electrically connected to the second resistor portion 32e. The second other resistor portion 32f is electrically connected to the element current circuit 72. The first resistor portion 31e is electrically connected to the element current circuit 72. The first other resistor portion 31f is electrically connected to the third resistor portion 33e. The third other resistor portion 33f is electrically connected to the element current circuit 72. The first connection point CP1 is a connection point between the first other element portion 11f and the second resistor portion 32e. The second connection point CP2 is a connection point between the first other resistor portion 31f and the third resistor portion 33e.

FIGS. 10, 11A to 11C, and 12A to 12C are schematic views illustrating a sensor according to the first embodiment.

Figure 10:
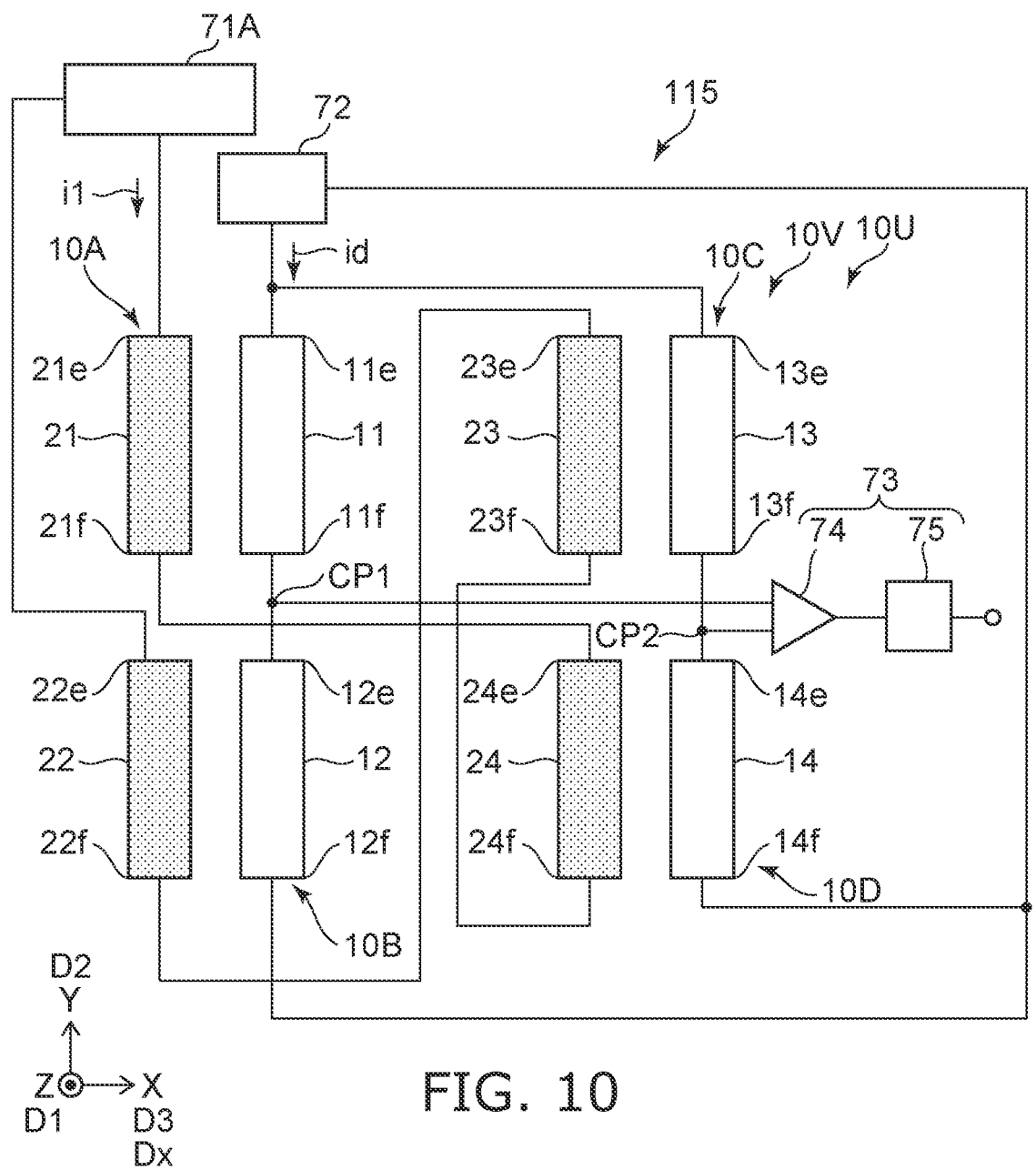
FIG. 10 is a schematic view illustrating a sensor according to the first embodiment.

As shown in FIG. 10, in a sensor 115 according to the embodiment, the element portion 10U includes the first element 10A, the second element 10B, a third element 10C and a fourth element 10D. The first element 10A includes the first magnetic element 11 and the first conductive member 21. The second element 10B includes the second magnetic element 12 and the second conductive member 22. The third element 10C includes a third magnetic element 13 and a third conductive member 23. The fourth element 10D includes a fourth magnetic element 14 and a fourth conductive member 24.

Figure 11A:
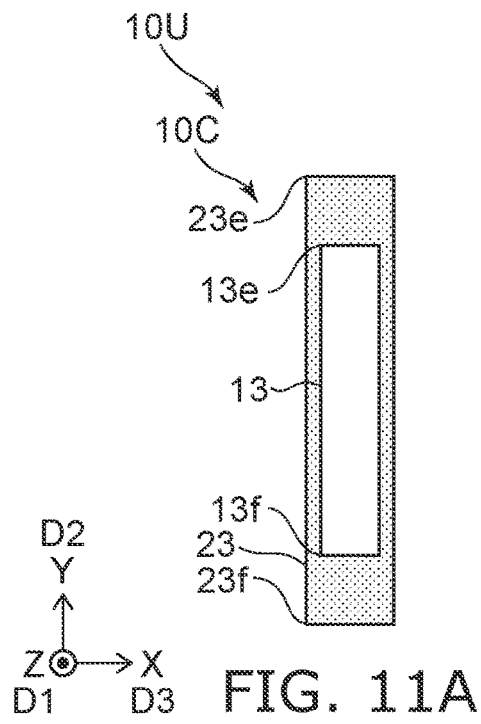
FIGS. 11A to 11C are schematic views illustrating the sensor according to the first embodiment.
Figure 11B:
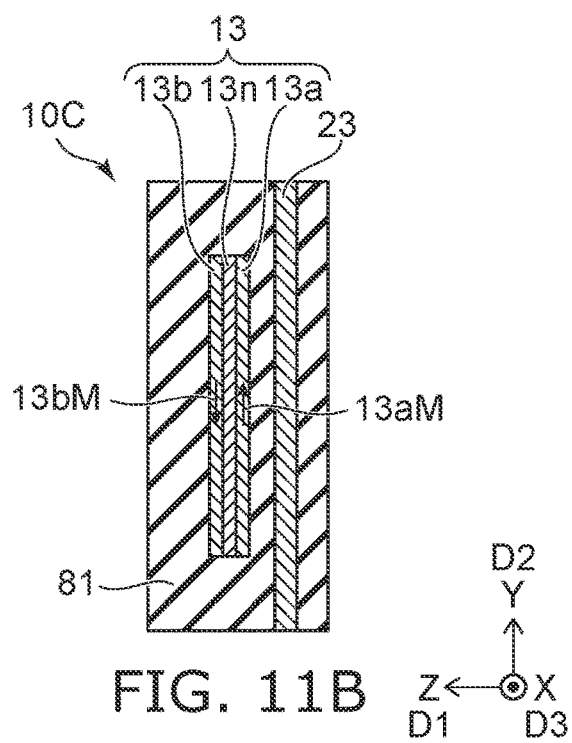
Figure 11C:
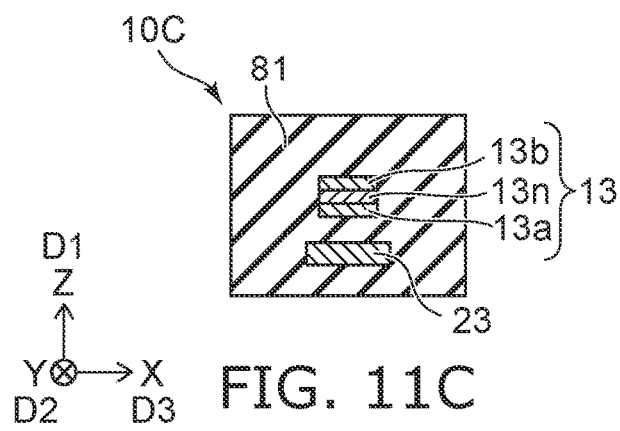

As shown in FIGS. 11B and 11C, the third magnetic element 13 includes a third magnetic layer 13a and a third opposing magnetic layer 13b. In this example, the third magnetic element 13 includes a third non-magnetic layer 13n. The third non-magnetic layer 13n is provided between the third magnetic layer 13a and the third opposing magnetic layer 13b.

In the third magnetic element 13, the third magnetic layer 13a may be, for example, one of the reference layer and the magnetization free layer. The third opposing magnetic layer 13b may be, for example, the other of the reference layer and the magnetization free layer. A change in the electrical resistance of the third magnetic element 13 is based on, for example, a change in the angle between the magnetization 13aM of the third magnetic layer 13a and the magnetization 13bM of the third opposing magnetic layer 13b according to the magnetic field applied to the third magnetic element 13.

Figure 12A:
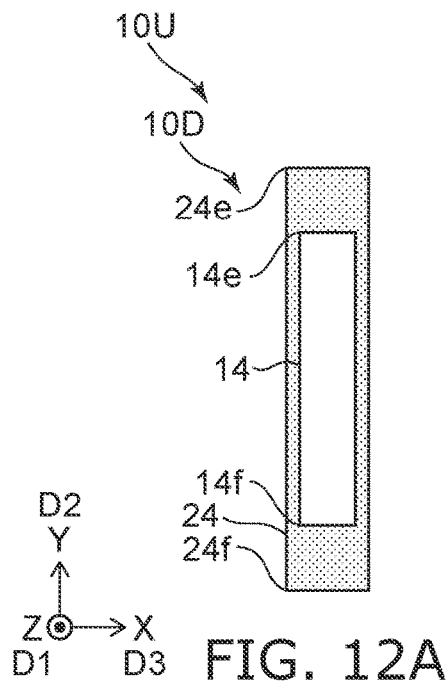
FIGS. 12A to 12C are schematic views illustrating the sensor according to the first embodiment.
Figure 12B:
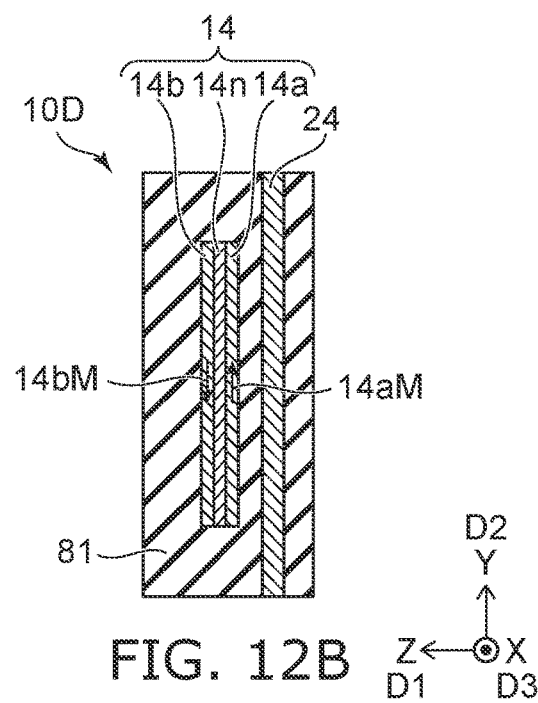
Figure 12C:
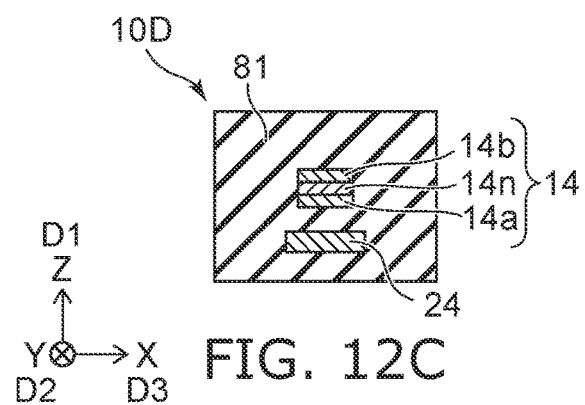

As shown in FIGS. 12B and 12C, the fourth magnetic element 14 includes a fourth magnetic layer 14a and a fourth opposing magnetic layer 14b. In this example, the fourth magnetic element 14 includes a fourth non-magnetic layer 14n. The fourth non-magnetic layer 14n is provided between the fourth magnetic layer 14a and the fourth opposing magnetic layer 14b.

In the fourth magnetic element 14, the fourth magnetic layer 14a may be, for example, one of the reference layer and the magnetization free layer. The fourth opposing magnetic layer 14b may be, for example, the other of the reference layer and the magnetization free layer. A change in the electrical resistance of the fourth magnetic element 14 is based on, for example, a change in the angle between the magnetization 14aM of the fourth magnetic layer 14a and the magnetization 14bM of the fourth opposing magnetic layer 14b according to the magnetic field applied to the fourth magnetic element 14.

As shown in FIG. 11A, the third conductive member 23 includes a third conductive portion 23e and a third other conductive portion 23f. A direction from the third other conductive portion 23f to the third conductive portion 23e is along the second direction D2.

As shown in FIG. 12A, the fourth conductive member 24 includes a fourth conductive portion 24e and a fourth other conductive portion 24f. A direction from the fourth other conductive portion 24f to the fourth conductive portion 24e is along the second direction D2.

As shown in FIG. 10, the first magnetic element 11 includes the first element portion 11e and the first other element portion 11f. The first element portion 11e corresponds to the first conductive portion 21e. The first other element portion 11f corresponds to the first other conductive portion 21f. The orientation from the first element portion 11e to the first other element portion 11f is the first orientation.

As shown in FIG. 10, the second magnetic element 12 includes the second element portion 12e and the second other element portion 12f. The second element portion 12e corresponds to the second conductive portion 22e. The second other element portion 12f corresponds to the second other conductive portion 22f. The orientation from the second element portion 12e to the second other element portion 12f is the second orientation.

As shown in FIG. 10, the third magnetic element 13 includes a third element portion 13e and a third other element portion 13f. The third element portion 13e corresponds to the third conductive portion 23e. The third other element portion 13f corresponds to the third other conductive portion 23f. An orientation from the third element portion 13e to the third other element portion 13f is a third orientation.

As shown in FIG. 10, the fourth magnetic element 14 includes a fourth element portion 14e and a fourth other element portion 14f. The fourth element portion 14e corresponds to the fourth conductive portion 24e. The fourth other element portion 14f corresponds to the fourth other conductive portion 24f. An orientation from the fourth element portion 14e to the fourth other element portion 14f is a fourth orientation.

The first element portion 11e is electrically connected to the element current circuit 72. The first other element portion 11f is electrically connected to the second element portion 12e. The second other element portion 12f is electrically connected to the element current circuit 72.

The third element portion 13e is electrically connected to the element current circuit 72. The third other element portion 13f is electrically connected to the fourth element portion 14e. The fourth other element portion 14f is electrically connected to the element current circuit 72.

The detection current id flows through the first magnetic element 11 in the first orientation, through the second magnetic element 12 in the second orientation, through the third magnetic element 13 in the third orientation, and through the fourth magnetic element 14 in the fourth orientation.

In this example, the first conductive portion 21e is electrically connected to the first circuit 71A. The first other conductive portion 21f is electrically connected to the fourth conductive portion 24e. The fourth other conductive portion 24f is electrically connected to the third other conductive portion 23f. The third conductive portion 23e is electrically connected to the second other conductive portion 22f. The second conductive portion 22e is electrically connected to the first circuit 71A.

When the first current i1 supplied from the first circuit 71A flows through the first conductive member 21 in the first orientation, the first current i1 flows through the second conductive member 22 in the opposite orientation to the second orientation, the first current i1 flows through the third conductive member 23 in the opposite orientation to the third orientation, and the first current i1 flows through the fourth conductive member 24 in the fourth orientation.

The first connection point CP1 is a connection point between the first other element portion 11f and the second element portion 12e. The second connection point CP2 is a connection point between the third other element portion 13f and the fourth element portion 14e.

Figure 13:
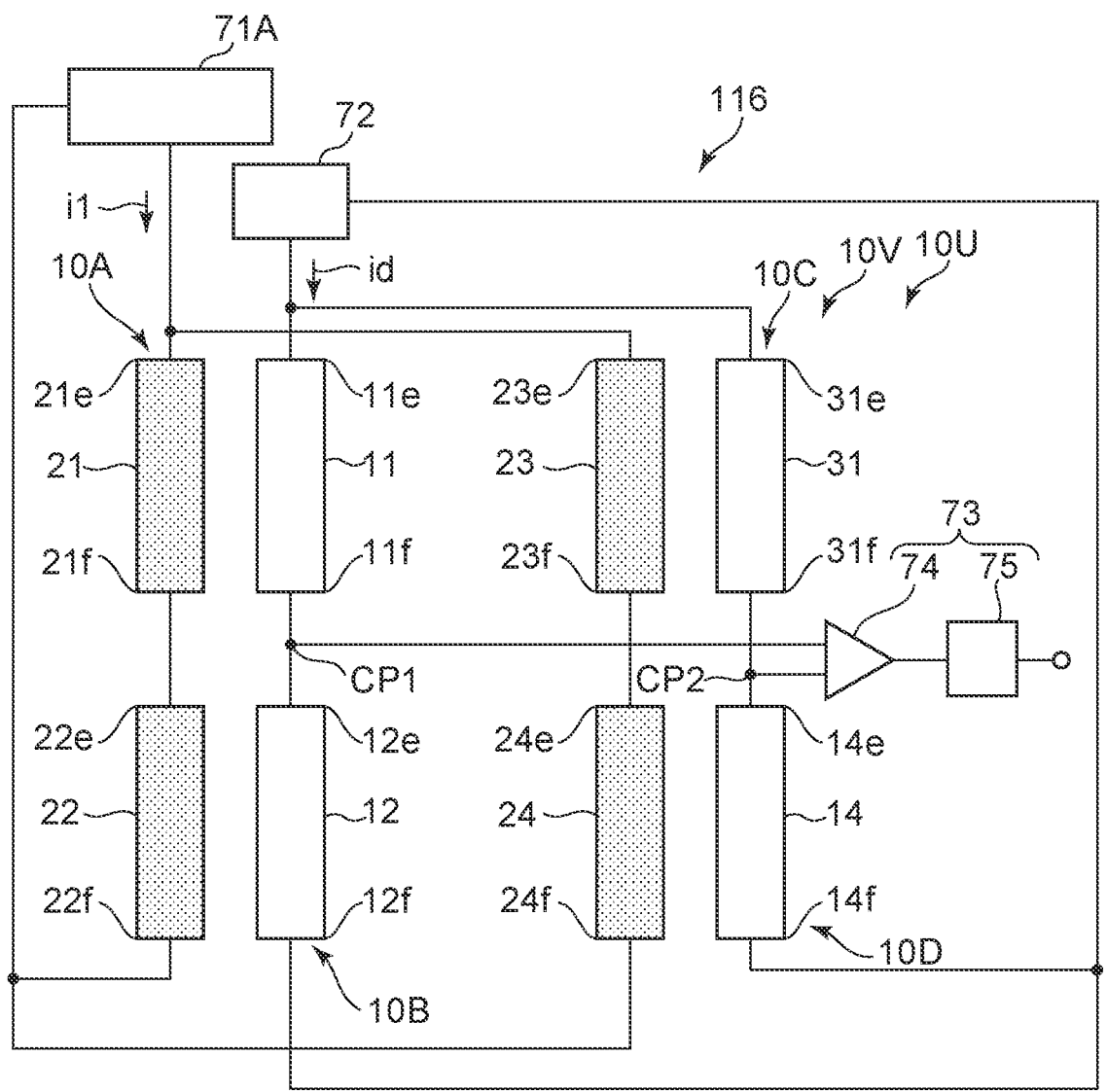
FIG. 13 is a schematic view illustrating a sensor according to the first embodiment.

FIG. 13 is a schematic view illustrating a sensor according to the first embodiment.

As shown in FIG. 13, in a sensor 116 according to the embodiment, the element portion 10U includes the first element 10A, the second element 10B, the third element 10C and the fourth element 10D. In the sensor 116, the connection relationship of the multiple conductive members is different from the connection relationship of the multiple conductive members in the sensor 115. In the sensor 116, the connection relationship between the multiple magnetic elements may be the same as the connection relationship between the multiple magnetic elements in the sensor 115.

In the sensor 116, the first conductive portion 21e and third conductive portion 23e are electrically connected to first circuit 71A. The first other conductive portion 21f is electrically connected to the second conductive portion 22e. The third other conductive portion 23f is electrically connected to the fourth conductive portion 24e. The second other conductive portion 22f and the fourth other conductive portion 24f are electrically connected to the first circuit 71A.

In the sensor 116, the magnetization orientation of the reference layer in the first magnetic element 11 is the same as the magnetization orientation of the reference layer in the fourth magnetic element 14. The magnetization orientation of the reference layer of the second magnetic element 12 is the same as the magnetization orientation of the reference layer in the third magnetic element 13. The orientation of magnetization of the reference layer in the first magnetic element 11 and the orientation of magnetization of the reference layer in the fourth magnetic element 14 are opposite to the orientation of magnetization of the reference layer in the second magnetic element 12 and the orientation of magnetization of the reference layer in the third magnetic element 13. In the configuration of the sensor 116 as well, it is possible to provide a sensor in which the influence of noise is suppressed and whose characteristics can be improved.

In the embodiments, a circuit may be provided to supply a current including an AC component to each of the second conductive member 22, the third conductive member 23 and the fourth conductive member 24. In each circuit, the DC component may be independently variable.

Figure 14:
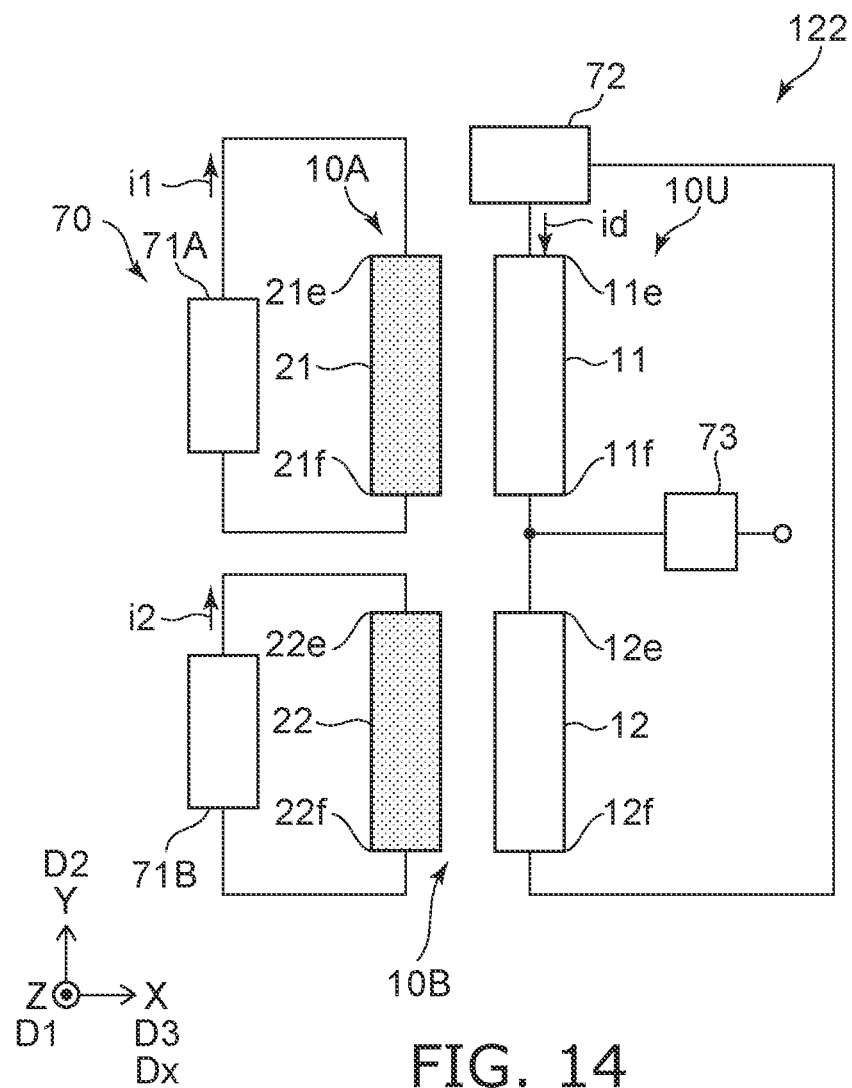
FIG. 14 is a schematic view illustrating a sensor according to the first embodiment.

FIG. 14 is a schematic view illustrating a sensor according to the first embodiment.

As shown in FIG. 14, in a sensor 122 according to the embodiment, the controller 70 further includes a second circuit 71B. The configuration of the sensor 122 excluding this may be the same as the configuration of the sensor 112.

For example, the element portion 10U further includes the second element 10B. The second element 10B includes the second magnetic element 12 and the second conductive member 22. As already explained, the second magnetic element 12 includes the second magnetic layer 12a and the second opposing magnetic layer 12b. The second conductive member 22 includes the second conductive portion 22e and the second other conductive portion 22f. The direction from the second other conductive portion 22f to the second conductive portion 22e is along the second direction D2.

The second circuit 71B is electrically connected to the second conductive portion 22e and the second other conductive portion 22f. The second circuit 71B is configured to supply a second current i2 to the second conductive member 22. The second current i2 includes an AC component. The local maximum value of the second current i2 is of the first polarity. The local minimum value of the second current i2 is of the first polarity or zero. The controller 70 may control the DC component of the second current i2 independently of the DC component id1 of the first current i1. For example, the difference in characteristics between the first element 10A and the second element 10B can be corrected.

Figure 15:
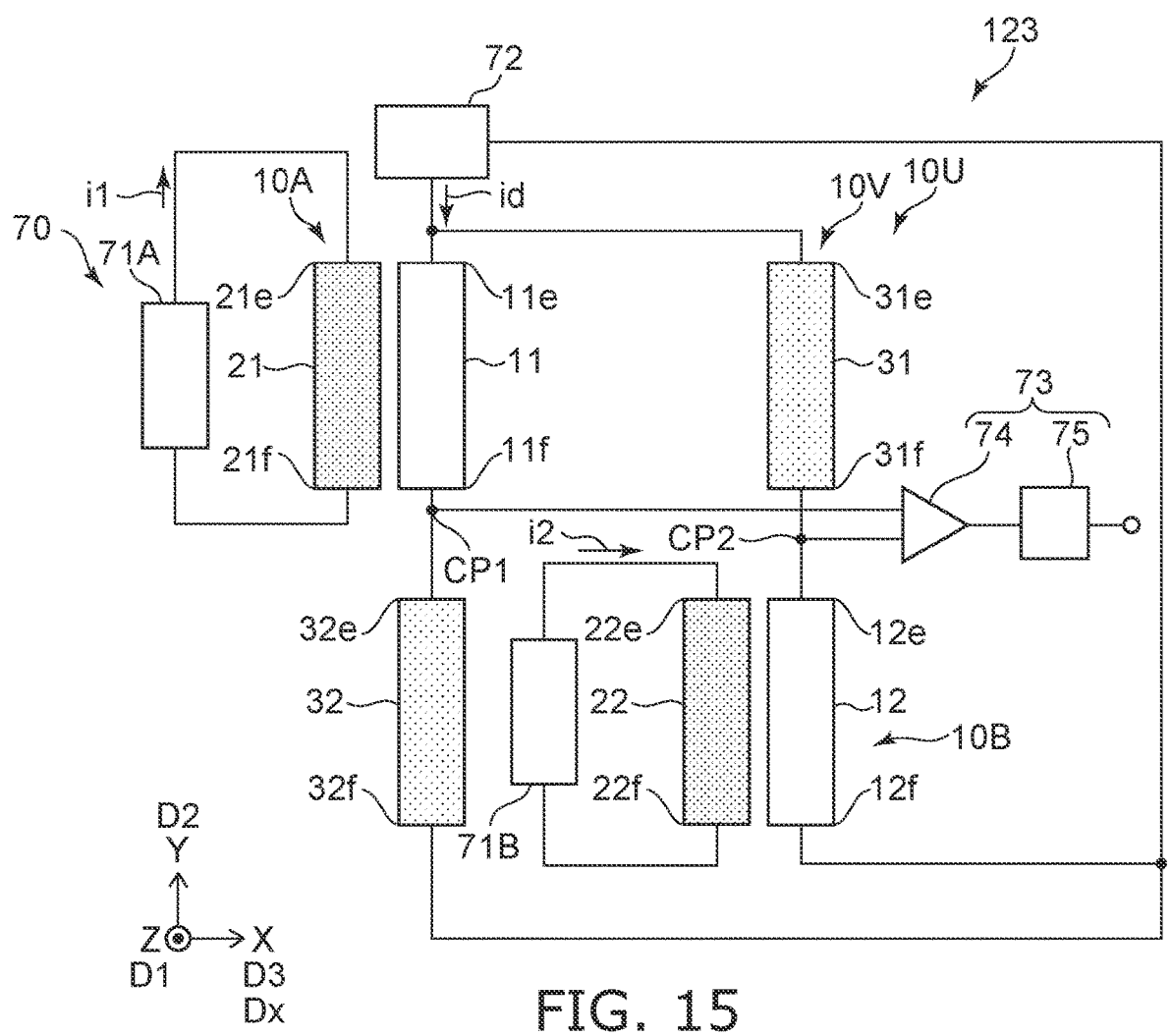
FIG. 15 is a schematic view illustrating a sensor according to the first embodiment.

FIG. 15 is a schematic view illustrating a sensor according to the first embodiment.

As shown in FIG. 15, in a sensor 123 according to the embodiment, the controller 70 further includes the second circuit 71B. The configuration of the sensor 123 excluding this may be the same as the configuration of the sensor 113. Also in the sensor 123, the controller 70 may control the DC component of the second current i2 independently of the DC component id1 of the first current i1.

Figure 16:
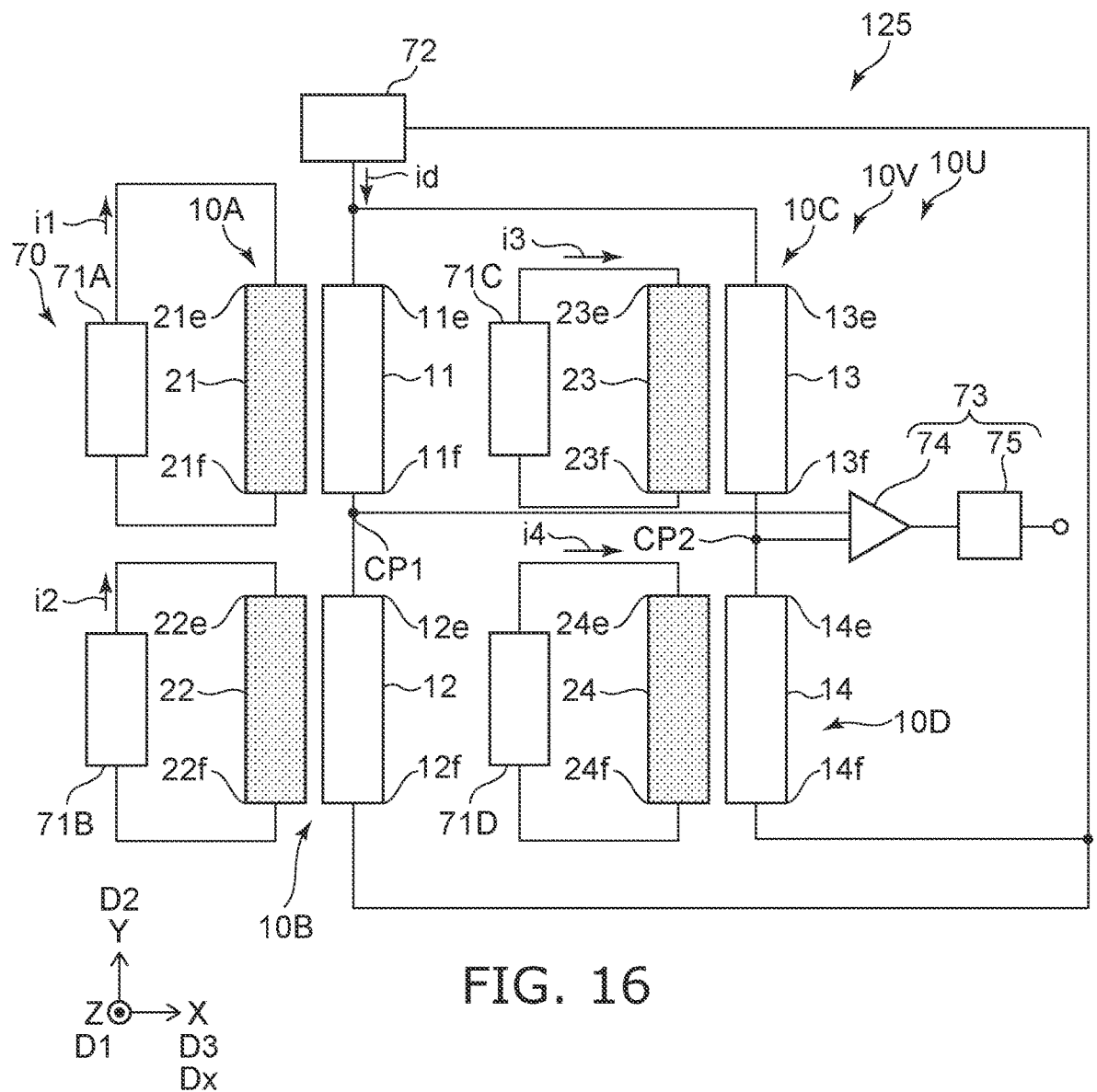
FIG. 16 is a schematic view illustrating a sensor according to the first embodiment.

FIG. 16 is a schematic view illustrating a sensor according to the first embodiment.

As shown in FIG. 16, in a sensor 125 according to the embodiment, the controller 70 includes the first circuit 71A, the second circuit 71B, a third circuit 71C and a fourth circuit 71D. Except for this, the configuration of the sensor 125 may be the same as the configuration of the sensor 115.

As described above, the second element 10B includes the second magnetic element 12 and the second conductive member 22. The second magnetic element 12 includes the second magnetic layer 12a and the second opposing magnetic layer 12b. The second conductive member 22 includes the second conductive portion 22e and the second other conductive portion 22f. The direction from the second other conductive portion 22f to the second conductive portion 22e is along the second direction D2.

As already described, the third element 10C includes the third magnetic element 13 and the third conductive member 23. The third magnetic element 13 includes the third magnetic layer 13a and the third opposing magnetic layer 13b. The third conductive member 23 includes the third conductive portion 23e and the third other conductive portion 23f. The direction from the third other conductive portion 23f to the third conductive portion 23e is along the second direction D2.

As already described, the fourth element 10D includes the fourth magnetic element 14 and the fourth conductive member 24. The fourth magnetic element 14 includes the fourth magnetic layer 14a and the fourth opposing magnetic layer 14b. The fourth conductive member 24 includes the fourth conductive portion 24e and the fourth other conductive portion 24f. The direction from the fourth other conductive portion 24f to the fourth conductive portion 24e is along the second direction D2.

The second circuit 71B is electrically connected to the second conductive portion 22e and the second other conductive portion 22f. The second circuit 71B is configured to supply the second current i2 to the second conductive member 22. The second current i2 includes an AC component. The local maximum value of the second current i2 is of the first polarity. The local minimum value of the second current i2 is of the first polarity or zero.

The third circuit 71C is electrically connected to the third conductive portion 23e and the third other conductive portion 23f. The third circuit 71C is configured to supply a third current i3 to the third conductive member 23. The third current i3 includes an AC component. The local maximum value of the third current i3 is of the first polarity. The minimum local value of the third current i3 is of the first polarity or zero.

The fourth circuit 71D is electrically connected to the fourth conductive portion 24e and the fourth other conductive portion 24f. The fourth circuit 71D is configured to supply a fourth current i4 to the fourth conductive member 24. The fourth current i4 includes an AC component. The local maximum value of the fourth current i4 is of the first polarity. The local minimum value of the fourth current i4 is of the first polarity or zero.

The controller 70 may be configured to control at least one of the DC component of the second current i2, the DC component of the third current i3, or the DC component of the fourth current i4 independently of the DC component id1 of the first current i1.

In the sensor 122, the phase of the AC component of second current i2 is opposite to the phase of the AC component of first current i1. In the sensor 123, the phase of the AC component of the second current i2 is the same as the phase of the AC component of the first current i1.

In the sensor 125, the phase of the AC component of the second current i2 is opposite to the phase of the AC component of the first current i1. In the sensor 125, the phase of the AC component of the third current i3 is opposite to the phase of the AC component of the first current i1. In the sensor 125, the phase of the AC component of the fourth current i4 is the same as the phase of the AC component of the first current i1.

Second Embodiment

The second embodiment relates to an inspection device. As will be described later, the inspection device may include a diagnostic device.

Figure 17:
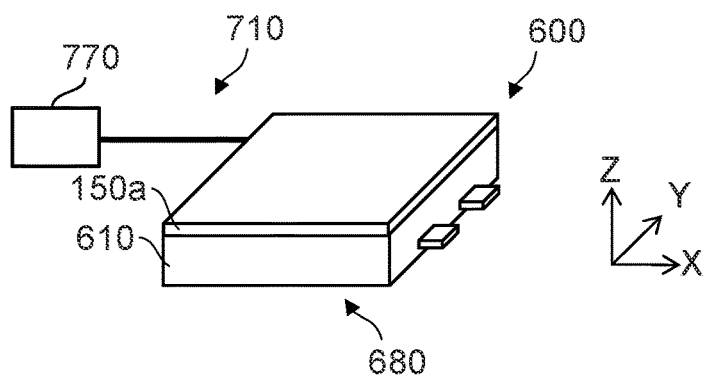
FIG. 17 is a schematic perspective view illustrating an inspection device according to a second embodiment.

FIG. 17 is a schematic perspective view illustrating an inspection device according to a second embodiment.

As shown in FIG. 17, an inspection device 710 according to the embodiment includes a sensor 150a (magnetic sensor) and a processor 770. The sensor 150a may be the sensor according to the first embodiment and a modification thereof. The processor 770 processes an output signal obtained from the sensor 150a. The processor 770 may compare the signal obtained from the sensor 150a with the reference value. The processor 770 can output the inspection result based on the processing result.

For example, the inspection device 710 inspects an inspection object 680. The inspection object 680 is, for example, an electronic device (including a semiconductor circuit or the like). The inspection object 680 may be, for example, a battery 610 or the like.

For example, the sensor 150a according to the embodiment may be used together with the battery 610. For example, a battery system 600 includes the battery 610 and the sensor 150a. The sensor 150a can detect the magnetic field generated by the current flowing through the battery 610.

Figure 18:
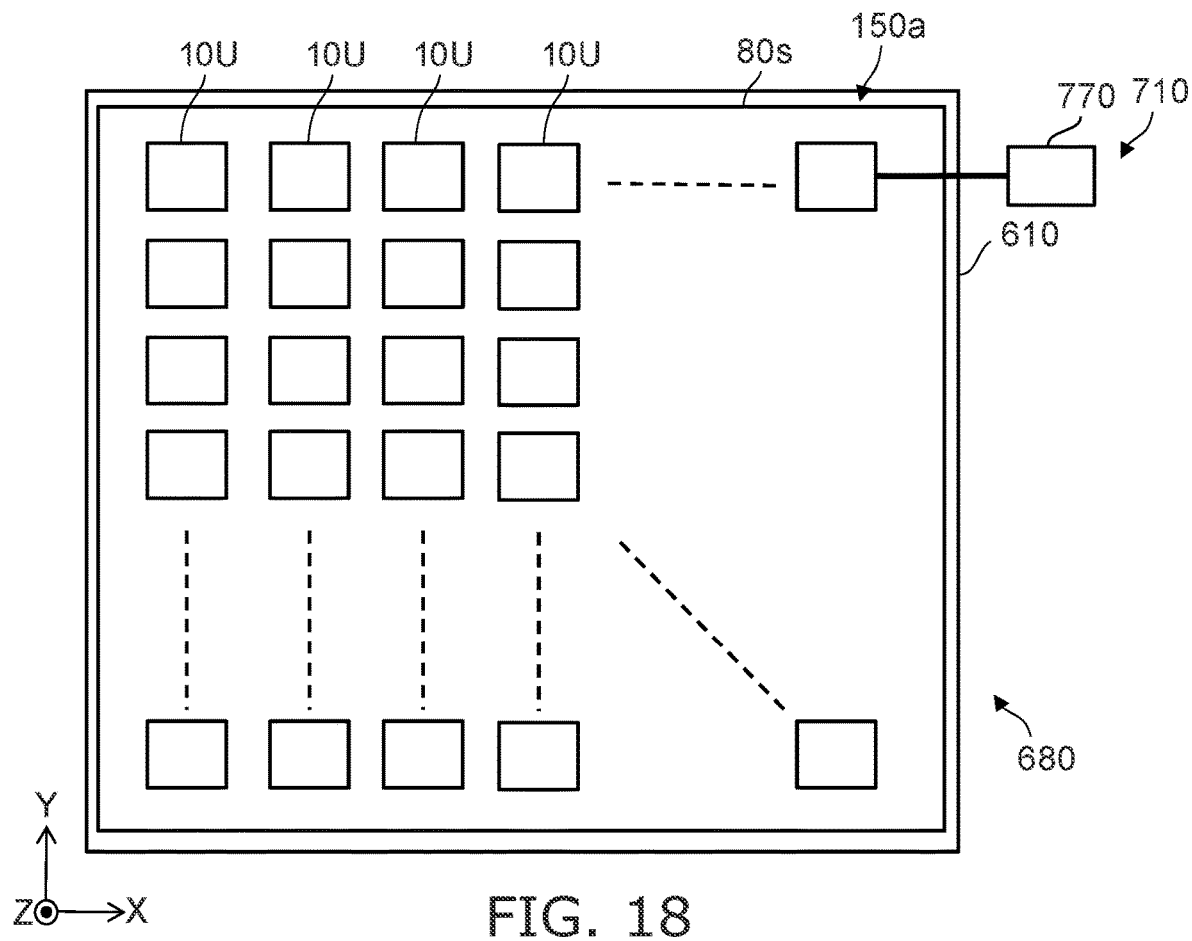
FIG. 18 is a schematic plan view illustrating the inspection device according to the second embodiment.

FIG. 18 is a schematic plan view illustrating the inspection device according to the second embodiment.

As shown in FIG. 18, the sensor 150a includes, for example, multiple sensors according to the embodiment. In this example, the sensor 150a includes multiple sensors (the element portion 10U such as the sensor 110, etc.). The multiple sensors are arranged along, for example, two directions (for example, the X-axis direction and the Y-axis direction). The multiple sensors 110 are provided, for example, on a substrate.

The sensor 150a can detect the magnetic field generated by the current flowing through the inspection object 680 (for example, the battery 610 may be used). For example, when the battery 610 approaches an abnormal state, an abnormal current may start to flow through the battery 610. By detecting the abnormal current with the sensor 150a, it is possible to know the change in the state of the battery 610. For example, in a state where the sensor 150a is placed close to the battery 610, the entire battery 610 can be inspected in a short time by moving the sensor array in two directions. The sensor 150a may be used for inspection of the battery 610 in manufacturing process of the battery 610.

The sensor according to the embodiment can be applied to, for example, the inspection device 710 such as a diagnostic device.

Figure 19:
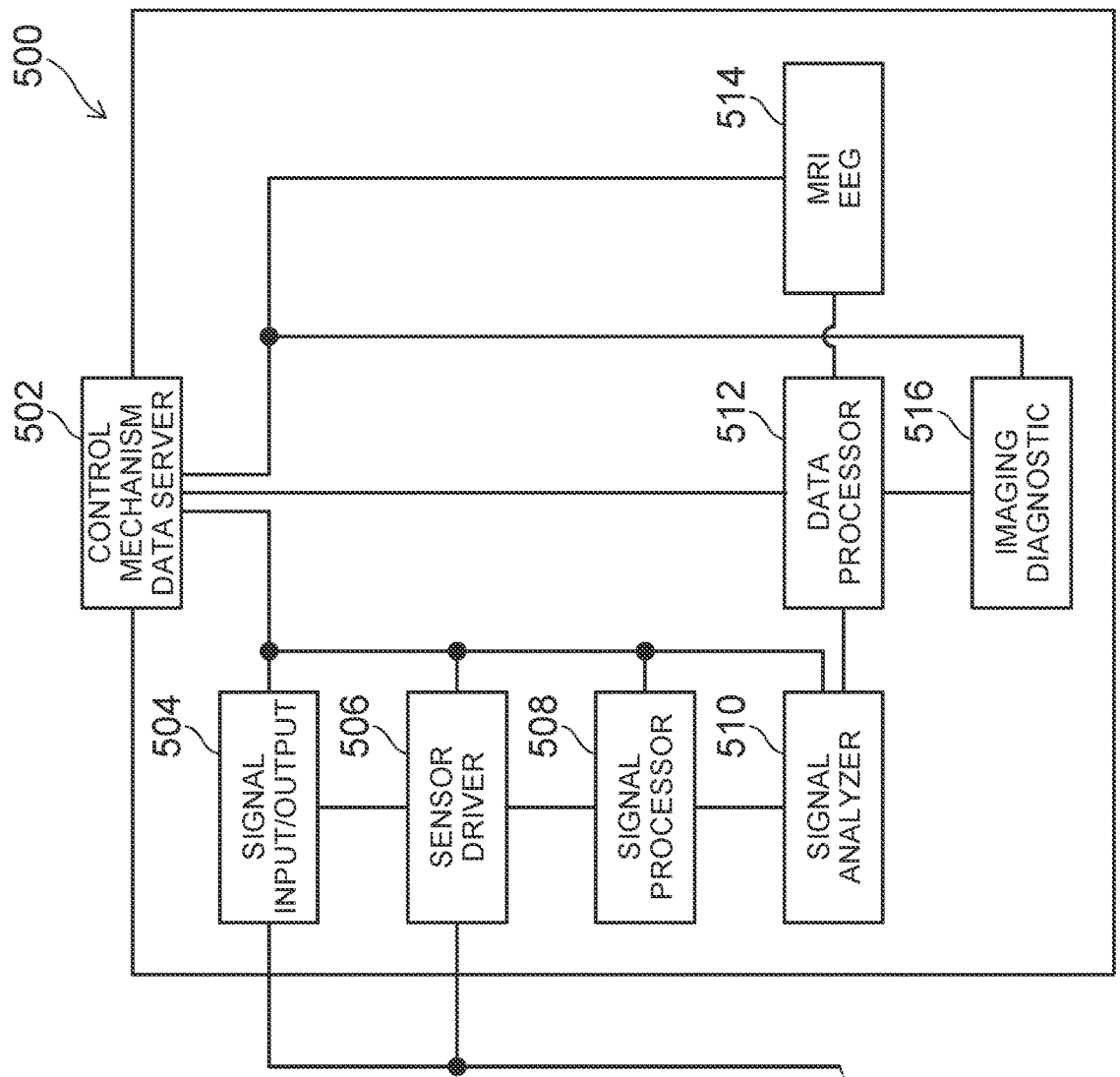
FIG. 19 is a schematic diagram illustrating the sensor and the inspection device according to the embodiment.
Figure 19:
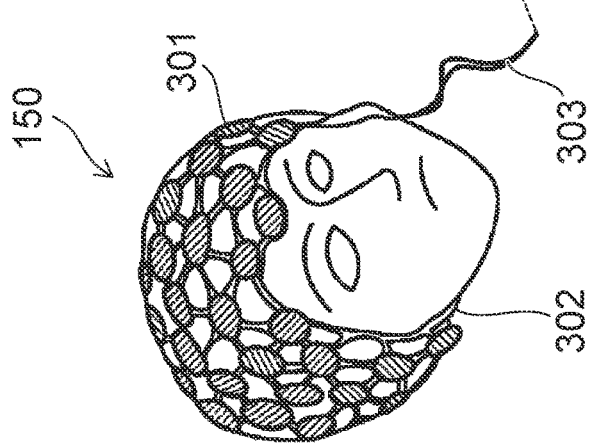

FIG. 19 is a schematic diagram illustrating the sensor and the inspection device according to the embodiment.

As shown in FIG. 19, a diagnostic apparatus 500, which is an example of the inspection device 710, includes a sensor 150. The sensor 150 includes the sensors described with respect to the first embodiment and modifications thereof.

In the diagnostic apparatus 500, the sensor 150 is, for example, a magnetoencephalograph. The magnetoencephalograph detects the magnetic field generated by the cranial nerves. When the sensor 150 is used in a magnetoencephalograph, the size of the magnetic element included in the sensor 150 is, for example, not less than 1 mm and less than 10 mm. This size is, for example, the length including an MFC.

As shown in FIG. 19, the sensor 150 (magnetoencephalogram) is attached to, for example, the head of a human body. The sensor 150 (magnetoencephalogram) includes a sensor part 301. The sensor 150 (magnetoencephalogram) may include multiple sensor parts 301. The number of the multiple sensor parts 301 is, for example, about 100 (for example, not less than 50 and not more than 150). The multiple sensor parts 301 are provided on a flexible base body 302.

The sensor 150 may include, for example, a circuit such as differential detection. The sensor 150 may include a sensor other than the sensor (for example, a potential terminal or an acceleration sensor).

A size of the sensor 150 is smaller than a size of a conventional SQUID sensor. Therefore, it is easy to install the multiple sensor parts 301. Installation of the multiple sensor parts 301 and other circuits is easy. The coexistence of the multiple sensor parts 301 and other sensors is easy.

The base body 302 may include an elastic body such as a silicone resin. For example, the multiple sensor parts 301 are provided to be connected to the base body 302. The base body 302 can be in close contact with the head, for example.

The input/output code 303 of the sensor part 301 is connected to a sensor driver 506 and a signal input/output 504 of the diagnostic apparatus 500. The magnetic field measurement is performed in the sensor part 301 based on the electric power from the sensor driver 506 and the control signal from the signal input/output 504. The result is input to the signal input/output 504. The signal obtained by the signal input/output 504 is supplied to a signal processor 508. The signal processor 508 performs processing such as noise removal, filtering, amplification, and signal calculation. The signal processed by the signal processor 508 is supplied to a signal analyzer 510. The signal analyzer 510 extracts, for example, a specific signal for magnetoencephalography measurement. In the signal analyzer 510, for example, signal analysis for matching signal phases is performed.

The output of the signal analyzer 510 (data for which signal analysis has been completed) is supplied to a data processor 512. The data processor 512 performs data analysis. In this data analysis, for example, image data such as MRI (Magnetic Resonance Imaging) can be incorporated. In this data analysis, for example, scalp potential information such as EEG (Electroencephalogram) can be incorporated. For example, a data part 514 such as MRI or EEG is connected to the data processor 512. By the data analysis, for example, nerve ignition point analysis, inverse problem analysis, and the like are performed.

The result of the data analysis is supplied to, for example, an imaging diagnostic 516. Imaging is performed in the imaging diagnostic 516. Imaging assists in diagnosis.

The above series of operations is controlled by, for example, a control mechanism 502. For example, necessary data such as primary signal data or metadata in the middle of data processing is stored in the data server. The data server and the control mechanism may be integrated.

The diagnostic apparatus 500 according to the embodiment includes the sensor 150 and the processor that processes an output signal obtained from the sensor 150. This processor includes, for example, at least one of a signal processor 508 or a data processor 512. The processor includes, for example, a computer.

In the sensor 150 shown in FIG. 19, the sensor part 301 is installed on the head of the human body. The sensor part 301 may be installed on the chest of the human body. This enables magnetocardiography measurement. For example, the sensor part 301 may be installed on the abdomen of a pregnant woman. This makes it possible to perform a fetal heartbeat test.

The sensor device including the subject is preferably installed in a shield room. Thereby, for example, the influence of geomagnetism or magnetic noise can be suppressed.

For example, a mechanism for locally shielding the measurement site of the human body or the sensor part 301 may be provided. For example, the sensor part 301 may be provided with a shield mechanism. For example, effective shielding may be performed in the signal analysis or the data processing.

In embodiments, the base body 302 may be flexible and may be substantially non-flexible. In the example shown in FIG. 19, the base body 302 is a continuous film processed into a hat shape. The base body 302 may be in a net shape. Thereby, for example, good wearability can be obtained. For example, the adhesion of the base body 302 to the human body is improved. The base body 302 may be helmet-shaped and may be rigid.

Figure 20:
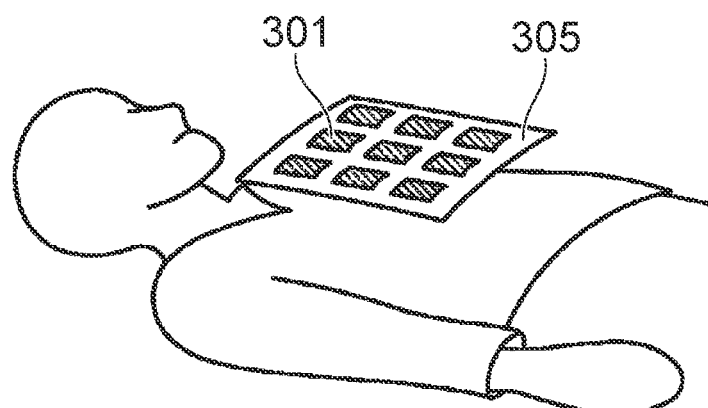
FIG. 20 is a schematic view illustrating the inspection device according to the embodiment.

FIG. 20 is a schematic view illustrating the inspection device according to the embodiment.

In the example shown in FIG. 20, the sensor part 301 is provided on a flat plate-shaped hard base body 305.

In the example shown in FIG. 20, the input/output of the signal obtained from the sensor part 301 is the same as the input/output described with respect to FIG. 20. In the example shown in FIG. 20, the processing of the signal obtained from the sensor part 301 is the same as the processing described with respect to FIG. 19.

There is a reference example of using a SQUID (Superconducting Quantum Interference Device) sensor as a device for measuring a weak magnetic field such as a magnetic field generated from a living body. In this reference example, since superconductivity is used, the device is large and the power consumption is also large. The burden on the measurement target (patient) is heavy.

According to the embodiment, the device can be downsized. Power consumption can be suppressed. The burden on the measurement object (patient) can be reduced. According to the embodiment, the SN ratio of magnetic field detection can be improved. Sensitivity can be improved.

The embodiments may include the following configurations (for example, technical proposals).

Configuration 1

A sensor, comprising:
an element portion including a first element, the first element including a first magnetic element and a first conductive member,
the first magnetic element including a first magnetic layer and a first opposing magnetic layer,
the first conductive member including a first conductive portion and a first other conductive portion, a second direction from the first other conductive portion to the first conductive portion crossing a first direction from the first magnetic layer to the first opposing magnetic layer, and
a rate of a change in a first electrical resistance of the first magnetic element with respect to a change in a third direction magnetic field along a third direction crossing a plane including the first direction and the second direction being higher than a rate of a change in the first electrical resistance with respect to a change in a second direction magnetic field along the second direction; and
a controller including a first circuit, the first circuit being electrically connected to the first conductive portion and the first other conductive portion, the first circuit being configured to supply a first current to the first conductive member, the first current including an AC component, a local maximum value of the first current being of the first polarity, and a local minimum value of the first current being of the first polarity or 0.

Configuration 2

The sensor according to Configuration 1, wherein a detection target magnetic field includes a component along the third direction.

Configuration 3

A sensor, comprising:
an element portion including a first element, the first element including a first magnetic element and a first conductive member,
the first magnetic element including a first magnetic layer and a first opposing magnetic layer, and
the first conductive member including a first conductive portion and a first other conductive portion, a second direction from the first other conductive portion to the first conductive portion crossing a first direction from the first magnetic layer to the first opposing magnetic layer; and
a controller including a first circuit, the first circuit being electrically connected to the first conductive portion and the first other conductive portion, the first circuit being configured to supply a first current to the first conductive member, the first current including an AC component, a local maximum value of the first current being of the first polarity, and a local minimum value of the first current being of the first polarity or 0,
a first electrical resistance of the first magnetic element being configured to change according to a detection target magnetic field, and
the detection target magnetic field including a component along a third direction crossing a plane including the first direction and the second direction.

Configuration 4

The sensor according to any one of Configurations 1 to 3, wherein a length of the first magnetic element in the second direction is longer than a length of the first magnetic element in the third direction.

Configuration 5

The sensor according to any one of Configurations 1 to 4, wherein
a first magnetic field generated from the first conductive member by the first current includes a first value magnetic field, a second value magnetic field, a third value magnetic field and a fourth value magnetic field,
the first value magnetic field is between 0 and the fourth value magnetic field,
the second value magnetic field is between the first value magnetic field and the fourth value magnetic field,
the third value magnetic field is between the second value magnetic field and the fourth value magnetic field,
a difference between the first value magnetic field and the second value magnetic field is same as a difference between the third value magnetic field and the fourth value magnetic field, and
a first rate of a change in the first electrical resistance with respect to a change between the first value magnetic field and the second value magnetic field is lower than a second rate of a change in the first electrical resistance with respect to a change between the third value magnetic field and the fourth value magnetic field.

Configuration 6

The sensor according to Configuration 5, wherein the magnetic field generated by the first current includes the third value magnetic field and the fourth value magnetic field.

Configuration 7

The sensor according to any one of Configurations 1 to 6, wherein the first electrical resistance changes as an even function with respect to a magnetic field applied to the first magnetic element.

Configuration 8

The sensor according to any one of Configurations 1 to 7, wherein
the controller includes an element current circuit, and
the element current circuit is configured to supply a detection current to the first magnetic element.

Configuration 9

The sensor according to Configuration 8, wherein
the controller includes a detection circuit, and
the detection circuit is configured to detect a value corresponding to a change in the first electrical resistance.

Configuration 10

The sensor according to Configuration 9, wherein
the element portion includes a bridge circuit including the first element, and
the detection circuit is configured to detect a value corresponding to a difference between a potential of a first midpoint of the bridge circuit and a potential of a second midpoint of the bridge circuit.

Configuration 11

The sensor according to Configuration 10, wherein
the element portion further includes a second element,
the second element includes a second magnetic element and a second conductive member,
the second magnetic element includes a second magnetic layer and a second opposing magnetic layer,
the second conductive member includes a second conductive portion and a second other conductive portion, a direction from the second other conductive portion to the second conductive portion is along the second direction,
the element portion further includes a second element,
the second element includes a second magnetic element and a second conductive member,
the second magnetic element includes a second magnetic layer and a second opposing magnetic layer,
the second conductive member includes a second conductive portion and a second other conductive portion, a direction from the second other conductive portion to the second conductive portion is along the second direction,
the first magnetic element includes a first element portion and a first other element portion, the first element portion corresponds to the first conductive portion, the first other element portion corresponds to the first other conductive portion, an orientation from the first element portion to the first other element portion is a first orientation,
the second magnetic element includes a second element portion and a second other element portion, the second element portion corresponds to the second conductive portion, the second other element portion corresponds to the second other conductive portion, an orientation from the second element portion to the second other element portion is a second orientation,
the detected current flows through the first magnetic element in the first orientation and through the second magnetic element in the second orientation, and
when the first current flows through the first conductive member in the first orientation, the first current flows through the second conductive member in the opposite orientation to the second orientation.

Configuration 12

The sensor according to Configuration 10, wherein
the element portion further includes:
a second element,
a first resistor, and
a second resistor,
the first magnetic element includes a first element portion and a first other element portion, the first element portion corresponds to the first conductive portion, the first other element portion corresponds to the first other conductive portion, an orientation from the first element portion to the first other element portion is a first orientation,
the second element includes a second magnetic element and a second conductive member,
the second magnetic element includes a second magnetic layer and a second opposing magnetic layer,
the second conductive member includes a second conductive portion and a second other conductive portion, a direction from the second other conductive portion to the second conductive portion is along the second direction,
the first resistor includes a first resistor portion and a first other resistor portion, a direction from the first other resistor portion to the first resistor portion is along the second direction,
the second resistor includes a second resistor portion and a second other resistor portion, a direction from the second other resistance portion to the second resistance portion is along the second direction,
the second magnetic element includes a second element portion and a second other element portion, the second element portion corresponds to the second conductive portion, the second other element portion corresponds to the second other conductive portion, an orientation from the second element portion to the second other element portion is a second orientation,
the first element portion is electrically connected to the element current circuit,
the first other element portion is electrically connected to the second resistor portion,
the second resistor portion is electrically connected to the element current circuit,
the first resistance portion is electrically connected to the element current circuit,
the first resistor portion is electrically connected to the second element portion,
the second other element portion is electrically connected to the element current circuit,
the detected current flows through the first magnetic element in the first orientation and through the second magnetic element in the second orientation, and
when the first current flows through the first conductive member in the first orientation, the first current flows through the second conductive member in the second orientation.

Configuration 13

The sensor according to Configuration 10, wherein
the element portion further includes:
a second element,
a third element, and
a fourth element,
the first magnetic element includes a first element portion and a first other element portion, the first element portion corresponds to the first conductive portion, the first other element portion corresponds to the first other conductive portion, a direction from the first element portion to the first other element portion is a first direction,
the second element includes a second magnetic element and a second conductive member,
the second magnetic element includes a second magnetic layer and a second opposed magnetic layer,
the second conductive member includes a second conductive portion and a second other conductive portion, a direction from the second other conductive portion to the second conductive portion is along the second direction,
the second magnetic element includes a second element portion and a second other element portion, the second element portion corresponds to the second conductive portion, the second other element portion corresponds to the second other conductive portion, an orientation from the second element portion to the second other element portion is a second orientation,
the third element includes a third magnetic element and a third conductive member,
the third magnetic element includes a third magnetic layer and a third counter magnetic layer,
the third conductive member includes a third conductive portion and a third other conductive portion, and a direction from the third other conductive portion to the third conductive portion is along the second direction,
the third magnetic element includes a third element portion and a third other element portion, the third element portion corresponds to the third conductive portion, the third other element portion corresponds to the third other conductive portion, an orientation from the third element portion to the third other element portion is a third orientation,
the fourth element includes a fourth magnetic element and a fourth conductive member,
the fourth magnetic element includes a fourth magnetic layer and a fourth counter magnetic layer,
the fourth conductive member includes a fourth conductive portion and a fourth other conductive portion, a direction from the fourth other conductive portion to the fourth conductive portion is along the second direction,
the fourth magnetic element includes a fourth element portion and a fourth other element portion, the fourth element portion corresponds to the fourth conductive portion, the fourth other element portion corresponds to the fourth other conductive portion, an orientation from the fourth element portion to the fourth other element portion is a fourth orientation,
the first element portion is electrically connected to the element current circuit,
the first other element portion is electrically connected to the second element portion,
the second other element portion is electrically connected to the element current circuit,
the third element portion is electrically connected to the element current circuit,
the third element portion is electrically connected to the fourth element portion,
the fourth other element portion is electrically connected to the element current circuit,
the detected current flows through the first magnetic element in the first orientation, flows through the second magnetic element in the second orientation, flows through the third magnetic element in the third orientation, and flows through the fourth magnetic element in the fourth orientation, and
when the first current flows through the first conductive member in the first orientation, the first current flows through the second conductive member in an opposite orientation to the second orientation, the first current flows through the third conductive member in an opposite orientation to the third orientation, and the first current flows through the fourth conductive member in the fourth orientation.

Configuration 14

The sensor according to Configuration 10, wherein
the element portion further includes a second element,
the second element includes a second magnetic element and a second conductive member,
the second magnetic element includes a second magnetic layer and a second opposing magnetic layer,
the second conductive member includes a second conductive portion and a second other conductive portion, a direction from the second other conductive portion to the second conductive portion is along the second direction,
the controller further includes a second circuit,
the second circuit is electrically connected to the second conductive portion and the second other conductive portion, the second circuit is configured to supply a second current to the second conductive member, the second current includes an AC component, a local maximum value of the second current is of a first polarity, a local minimum value of the second current is of the first polarity or zero, and
the controller is configured to control a DC component of the second current independently of a DC component of the first current.

Configuration 15

The sensor according to Configuration 10, wherein
the element portion further includes:
a second element,
a third element, and
a fourth element,
the second element includes a second magnetic element and a second conductive member,
the second magnetic element includes a second magnetic layer and a second opposed magnetic layer,
the second conductive member includes a second conductive portion and a second other conductive portion, a direction from the second other conductive portion to the second conductive portion is along the second direction,
the third element includes a third magnetic element and a third conductive member,
the third magnetic element includes a third magnetic layer and a third counter magnetic layer,
the third conductive member includes a third conductive portion and a third other conductive portion, and the direction from the third other conductive portion to the third conductive portion is along the second direction, the fourth magnetic element includes a fourth magnetic layer and a fourth counter magnetic layer, the fourth conductive member includes a fourth conductive portion and a fourth other conductive portion, a direction from the fourth other conductive portion to the fourth conductive portion is along the second direction, the controller further includes a second circuit, a third circuit, and a fourth circuit, the second circuit is electrically connected to the second conductive portion and the second other conductive portion, the second circuit is configured to supply a second current to the second conductive member, the second current includes an AC component, a local maximum value of the second current is of the first polarity, and a local minimum value of the second current is of the first polarity or zero, the third circuit is electrically connected to the third conductive portion and the third other conductive portion, the third circuit is configured to supply a third current to the third conductive member, the third current includes an AC component, a local maximum value of the third current is of the first polarity, and a local minimum value of the third current is of the first polarity or zero, and the fourth circuit is electrically connected to the fourth conductive portion and the fourth other conductive portion, the fourth circuit is configured to supply a fourth current to the fourth conductive member, the fourth current includes an AC component, a local maximum value of the fourth current is of the first polarity, and a local minimum value of the fourth current is of the first polarity or 0.

Configuration 16

The sensor according to Configuration 15, wherein the controller is configured to control at least one of a DC component of the second current, a DC component of the third current, or a DC component of the fourth current independently of a DC component of the first current.

Configuration 17

The sensor according to any one of Configurations 1 to 16, wherein a direction from the first conductive member to the first magnetic element is along the first direction.

Configuration 18

An inspection device, comprising:
the sensor according to any one of Configurations 1 to 17; and
a processor configured to process an output signal obtained from the sensor.

According to the embodiments, it is possible to provide a sensor and an inspection device capable of improving characteristics.

In the present specification, "perpendicular" and "parallel" include not only strict perpendicularity and strict parallelism, but also variations in the manufacturing process, for example, and may be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the sensors or the inspection devices such as magnetic layers, magnetic elements, conductive members, controllers, processors, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors and all inspection devices practicable by an appropriate design modification by one skilled in the art based on the sensors and the inspection devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising:
an element portion including a first element, the first element including a first magnetic element and a first conductive member,
the first magnetic element including a first magnetic layer and a first opposing magnetic layer, wherein a first direction is defined from the first magnetic layer to the first opposing magnetic layer,
the first conductive member including a first conductive portion and a first other conductive portion, wherein a second direction is defined from the first other conductive portion to the first conductive portion, the second direction crossing the first direction, and a third direction is defined crossing a plane including the first direction and the second direction, and
a rate of a change in a first electrical resistance of the first magnetic element with respect to a change in a third direction magnetic field along the third direction being higher than a rate of a change in the first electrical resistance with respect to a change in a second direction magnetic field along the second direction; and
a controller including a first circuit, the first circuit being electrically connected to the first conductive portion and the first other conductive portion, the first circuit being configured to supply a first current to the first conductive member, the first current including an AC component, a local maximum value of the first current being of the first polarity, and a local minimum value of the first current being of the first polarity or 0.

2. The sensor according to claim 1, wherein a detection target magnetic field includes a component along the third direction.

3. The sensor according to claim 1, wherein a length of the first magnetic element in the second direction is longer than a length of the first magnetic element in the third direction.

4. The sensor according to claim 1, wherein
a first magnetic field generated from the first conductive member by the first current includes a first value magnetic field, a second value magnetic field, a third value magnetic field and a fourth value magnetic field,
the first value magnetic field is between 0 and the fourth value magnetic field,
the second value magnetic field is between the first value magnetic field and the fourth value magnetic field,
the third value magnetic field is between the second value magnetic field and the fourth value magnetic field,
a difference between the first value magnetic field and the second value magnetic field is same as a difference between the third value magnetic field and the fourth value magnetic field, and
a first rate of a change in the first electrical resistance with respect to a change between the first value magnetic field and the second value magnetic field is lower than a second rate of a change in the first electrical resistance with respect to a change between the third value magnetic field and the fourth value magnetic field.

5. The sensor according to claim 4, wherein the magnetic field generated by the first current includes the third value magnetic field and the fourth value magnetic field.

6. The sensor according to claim 1, wherein the first electrical resistance changes as an even function with respect to a magnetic field applied to the first magnetic element.

7. The sensor according to claim 1, wherein
the controller includes an element current circuit, and
the element current circuit is configured to supply a detection current to the first magnetic element.

8. The sensor according to claim 7, wherein
the controller includes a detection circuit, and
the detection circuit is configured to detect a value corresponding to a change in the first electrical resistance.

9. The sensor according to claim 8, wherein
the element portion includes a bridge circuit including the first element, and
the detection circuit is configured to detect a value corresponding to a difference between a potential of a first midpoint of the bridge circuit and a potential of a second midpoint of the bridge circuit.

10. The sensor according to claim 9, wherein
the element portion further includes a second element,
the second element includes a second magnetic element and a second conductive member,
the second magnetic element includes a second magnetic layer and a second opposing magnetic layer,
the second conductive member includes a second conductive portion and a second other conductive portion, a direction from the second other conductive portion to the second conductive portion is along the second direction,
the element portion further includes a second element,
the second element includes a second magnetic element and a second conductive member,
the second magnetic element includes a second magnetic layer and a second opposing magnetic layer,
the second conductive member includes a second conductive portion and a second other conductive portion, a direction from the second other conductive portion to the second conductive portion is along the second direction,
the first magnetic element includes a first element portion and a first other element portion, the first element portion corresponds to the first conductive portion, the first other element portion corresponds to the first other conductive portion, an orientation from the first element portion to the first other element portion is a first orientation,
the second magnetic element includes a second element portion and a second other element portion, the second element portion corresponds to the second conductive portion, the second other element portion corresponds to the second other conductive portion, an orientation from the second element portion to the second other element portion is a second orientation,
the detected current flows through the first magnetic element in the first orientation and through the second magnetic element in the second orientation, and
when the first current flows through the first conductive member in the first orientation, the first current flows through the second conductive member in the opposite orientation to the second orientation.

11. The sensor according to claim 9, wherein
the element portion further includes:
a second element,
a first resistor, and
a second resistor,
the first magnetic element includes a first element portion and a first other element portion, the first element portion corresponds to the first conductive portion, the first other element portion corresponds to the first other conductive portion, an orientation from the first element portion to the first other element portion is a first orientation,
the second element includes a second magnetic element and a second conductive member,
the second magnetic element includes a second magnetic layer and a second opposing magnetic layer,
the second conductive member includes a second conductive portion and a second other conductive portion, a direction from the second other conductive portion to the second conductive portion is along the second direction,
the first resistor includes a first resistor portion and a first other resistor portion, a direction from the first other resistor portion to the first resistor portion is along the second direction,
the second resistor includes a second resistor portion and a second other resistor portion, a direction from the second other resistance portion to the second resistance portion is along the second direction,
the second magnetic element includes a second element portion and a second other element portion, the second element portion corresponds to the second conductive portion, the second other element portion corresponds to the second other conductive portion, an orientation from the second element portion to the second other element portion is a second orientation,
the first element portion is electrically connected to the element current circuit,
the first other element portion is electrically connected to the second resistor portion,
the second resistor portion is electrically connected to the element current circuit,
the first resistance portion is electrically connected to the element current circuit,
the first resistor portion is electrically connected to the second element portion,
the second other element portion is electrically connected to the element current circuit, the detected current flows through the first magnetic element in the first orientation and through the second magnetic element in the second orientation, and when the first current flows through the first conductive member in the first orientation, the first current flows through the second conductive member in the second orientation.

12. The sensor according to claim 9, wherein
the element portion further includes:
a second element,
a third element, and
a fourth element,
the first magnetic element includes a first element portion and a first other element portion, the first element portion corresponds to the first conductive portion, the first other element portion corresponds to the first other conductive portion, a direction from the first element portion to the first other element portion is a first direction,
the second element includes a second magnetic element and a second conductive member,
the second magnetic element includes a second magnetic layer and a second opposed magnetic layer,
the second conductive member includes a second conductive portion and a second other conductive portion, a direction from the second other conductive portion to the second conductive portion is along the second direction,
the second magnetic element includes a second element portion and a second other element portion, the second element portion corresponds to the second conductive portion, the second other element portion corresponds to the second other conductive portion, an orientation from the second element portion to the second other element portion is a second orientation,
the third element includes a third magnetic element and a third conductive member,
the third magnetic element includes a third magnetic layer and a third counter magnetic layer,
the third conductive member includes a third conductive portion and a third other conductive portion, and a direction from the third other conductive portion to the third conductive portion is along the second direction,
the third magnetic element includes a third element portion and a third other element portion, the third element portion corresponds to the third conductive portion,
the third other element portion corresponds to the third other conductive portion, an orientation from the third element portion to the third other element portion is a third orientation,
the fourth element includes a fourth magnetic element and a fourth conductive member,
the fourth magnetic element includes a fourth magnetic layer and a fourth counter magnetic layer,
the fourth conductive member includes a fourth conductive portion and a fourth other conductive portion, a direction from the fourth other conductive portion to the fourth conductive portion is along the second direction,
the fourth magnetic element includes a fourth element portion and a fourth other element portion, the fourth element portion corresponds to the fourth conductive portion,
the fourth other element portion corresponds to the fourth other conductive portion, an orientation from the fourth element portion to the fourth other element portion is a fourth orientation, the first element portion is electrically connected to the element current circuit,
the first other element portion is electrically connected to the second element portion,
the second other element portion is electrically connected to the element current circuit,
the third element portion is electrically connected to the element current circuit,
the third element portion is electrically connected to the fourth element portion,
the fourth other element portion is electrically connected to the element current circuit,
the detected current flows through the first magnetic element in the first orientation, flows through the second magnetic element in the second orientation, flows through the third magnetic element in the third orientation, and flows through the fourth magnetic element in the fourth orientation, and
when the first current flows through the first conductive member in the first orientation, the first current flows through the second conductive member in an opposite orientation to the second orientation, the first current flows through the third conductive member in an opposite orientation to the third orientation, and the first current flows through the fourth conductive member in the fourth orientation.

13. The sensor according to claim 9, wherein
the element portion further includes a second element,
the second element includes a second magnetic element and a second conductive member,
the second magnetic element includes a second magnetic layer and a second opposing magnetic layer,
the second conductive member includes a second conductive portion and a second other conductive portion, a direction from the second other conductive portion to the second conductive portion is along the second direction,
the controller further includes a second circuit,
the second circuit is electrically connected to the second conductive portion and the second other conductive portion, the second circuit is configured to supply a second current to the second conductive member, the second current includes an AC component, a local maximum value of the second current is of a first polarity, a local minimum value of the second current is of the first polarity or zero, and
the controller is configured to control a DC component of the second current independently of a DC component of the first current.

14. The sensor according to claim 9, wherein
the element portion further includes:
a second element,
a third element, and
a fourth element,
the second element includes a second magnetic element and a second conductive member,
the second magnetic element includes a second magnetic layer and a second opposed magnetic layer,
the second conductive member includes a second conductive portion and a second other conductive portion, a direction from the second other conductive portion to the second conductive portion is along the second direction,
the third element includes a third magnetic element and a third conductive member,
the third magnetic element includes a third magnetic layer and a third counter magnetic layer, the third conductive member includes a third conductive portion and a third other conductive portion, and the direction from the third other conductive portion to the third conductive portion is along the second direction, the fourth magnetic element includes a fourth magnetic layer and a fourth counter magnetic layer, the fourth conductive member includes a fourth conductive portion and a fourth other conductive portion, a direction from the fourth other conductive portion to the fourth conductive portion is along the second direction, the controller further includes a second circuit, a third circuit, and a fourth circuit, the second circuit is electrically connected to the second conductive portion and the second other conductive portion, the second circuit is configured to supply a second current to the second conductive member, the second current includes an AC component, a local maximum value of the second current is of the first polarity, and a local minimum value of the second current is of the first polarity or zero, the third circuit is electrically connected to the third conductive portion and the third other conductive portion, the third circuit is configured to supply a third current to the third conductive member, the third current includes an AC component, a local maximum value of the third current is of the first polarity, and a local minimum value of the third current is of the first polarity or zero, and the fourth circuit is electrically connected to the fourth conductive portion and the fourth other conductive portion, the fourth circuit is configured to supply a fourth current to the fourth conductive member, the fourth current includes an AC component, a local maximum value of the fourth current is of the first polarity, and a local minimum value of the fourth current is of the first polarity or 0.

15. The sensor according to claim 14, wherein the controller is configured to control at least one of a DC component of the second current, a DC component of the third current, or a DC component of the fourth current independently of a DC component of the first current.

16. The sensor according to claim 1, wherein a direction from the first conductive member to the first magnetic element is along the first direction.

17. An inspection device, comprising:
the sensor according to claim 1; and
a processor configured to process an output signal obtained from the sensor.

18. A sensor, comprising:
an element portion including a first element, the first element including a first magnetic element and a first conductive member,
  the first magnetic element including a first magnetic layer and a first opposing magnetic layer, wherein a first direction is defined from the first magnetic layer to the first opposing magnetic layer, and
  the first conductive member including a first conductive portion and a first other conductive portion, wherein a second direction is defined from the first other conductive portion to the first conductive portion, the second direction crossing the first and a third direction is defined crossing a plane including the first direction and the second direction; and
a controller including a first circuit, the first circuit being electrically connected to the first conductive portion and the first other conductive portion, the first circuit being configured to supply a first current to the first conductive member, the first current including an AC component, a local maximum value of the first current being of the first polarity, and a local minimum value of the first current being of the first polarity or 0,
a first electrical resistance of the first magnetic element being configured to change according to a detection target magnetic field, and
the detection target magnetic field including a component along the third direction.

\* \* \* \* \*